US 12,041,725 B2

(12) United States Patent
Matsushita et al.

(10) Patent No.: US 12,041,725 B2
(45) Date of Patent: Jul. 16, 2024

(54) COMPONENT REPLENISHMENT MANAGEMENT APPARATUS, COMPONENT MOUNTING SYSTEM AND COMPONENT REPLENISHMENT MANAGEMENT METHOD

(71) Applicant: YAMAHA HATSUDOKI KABUSHIKI KAISHA, Iwata (JP)

(72) Inventors: Yuichi Matsushita, Iwata (JP); Yoichi Matsushita, Iwata (JP)

(73) Assignee: YAMAHA HATSUDOKI KABUSHIKI KAISHA, Iwata (JP)

( * ) Notice: Subject to any disclaimer, the term of this patent is extended or adjusted under 35 U.S.C. 154(b) by 982 days.

(21) Appl. No.: 16/979,116

(22) PCT Filed: Mar. 30, 2018

(86) PCT No.: PCT/JP2018/013621
§ 371 (c)(1),
(2) Date: Sep. 8, 2020

(87) PCT Pub. No.: WO2019/187008
PCT Pub. Date: Oct. 3, 2019

(65) Prior Publication Data
US 2020/0404819 A1  Dec. 24, 2020

(51) Int. Cl.
*H05K 13/08*  (2006.01)
*G05B 19/416*  (2006.01)
*H05K 13/02*  (2006.01)

(52) U.S. Cl.
CPC ......... *H05K 13/086* (2018.08); *G05B 19/416* (2013.01); *H05K 13/02* (2013.01);
(Continued)

(58) Field of Classification Search
CPC .............. H05K 13/086; H05K 13/085; H05K 13/0882; H05K 13/00; H05K 13/08; Y10T 29/53004; Y10T 29/53174
(Continued)

(56) References Cited

U.S. PATENT DOCUMENTS 7,801,634 B2 *  9/2010  Kurata ............. G05B 19/41865
                                                        702/182
9,836,042 B2 * 12/2017  Maenishi ............. H05K 13/085

FOREIGN PATENT DOCUMENTS

JP    2011204824 A    10/2011
JP    2012-028660 A    2/2012
(Continued)

OTHER PUBLICATIONS

International Search Report issued in PCT/JP2018/013621; mailed Jun. 12, 2018.

*Primary Examiner* — Thiem D Phan
(74) *Attorney, Agent, or Firm* — Studebaker & Brackett PC

(57) ABSTRACT

The attachment possible period during which the attachment operation of the component supply reel can be performed is predicted for each of the tape feeders equipped in the component mounting apparatus, and the attachment time indicating a timing of the attachment operation is set to overlap the attachment possible periods of the candidate feeders, out of the tape feeders. Therefore, a frequency of the component replenishment operation of the operator can be suppressed. Further, the execution mode of the attachment operation for the candidate feeder corresponding to the attachment time is determined based on the number of the components planned to be supplied in accordance with the production planning by the candidate feeder. Therefore, a
(Continued)

number of the components suitable for the production planning of the components-mounted boards can be replenished.

20 Claims, 16 Drawing Sheets

(52) U.S. Cl.
CPC . *H05K 13/085* (2018.08); *G05B 2219/45054* (2013.01); *Y10T 29/53174* (2015.01)

(58) Field of Classification Search
USPC .......................... 29/739, 729, 740, 829, 832
See application file for complete search history.

(56) References Cited

FOREIGN PATENT DOCUMENTS

| | | | |
|---|---|---|---|
| JP | 2015-041734 | A | 3/2015 |
| JP | 2015-053320 | A | 3/2015 |
| JP | 2015-130403 | A | 7/2015 |
| JP | 2015-170801 | A | 9/2015 |
| JP | 2016-225385 | A | 12/2016 |
| JP | 2017143225 | A | 8/2017 |

* cited by examiner

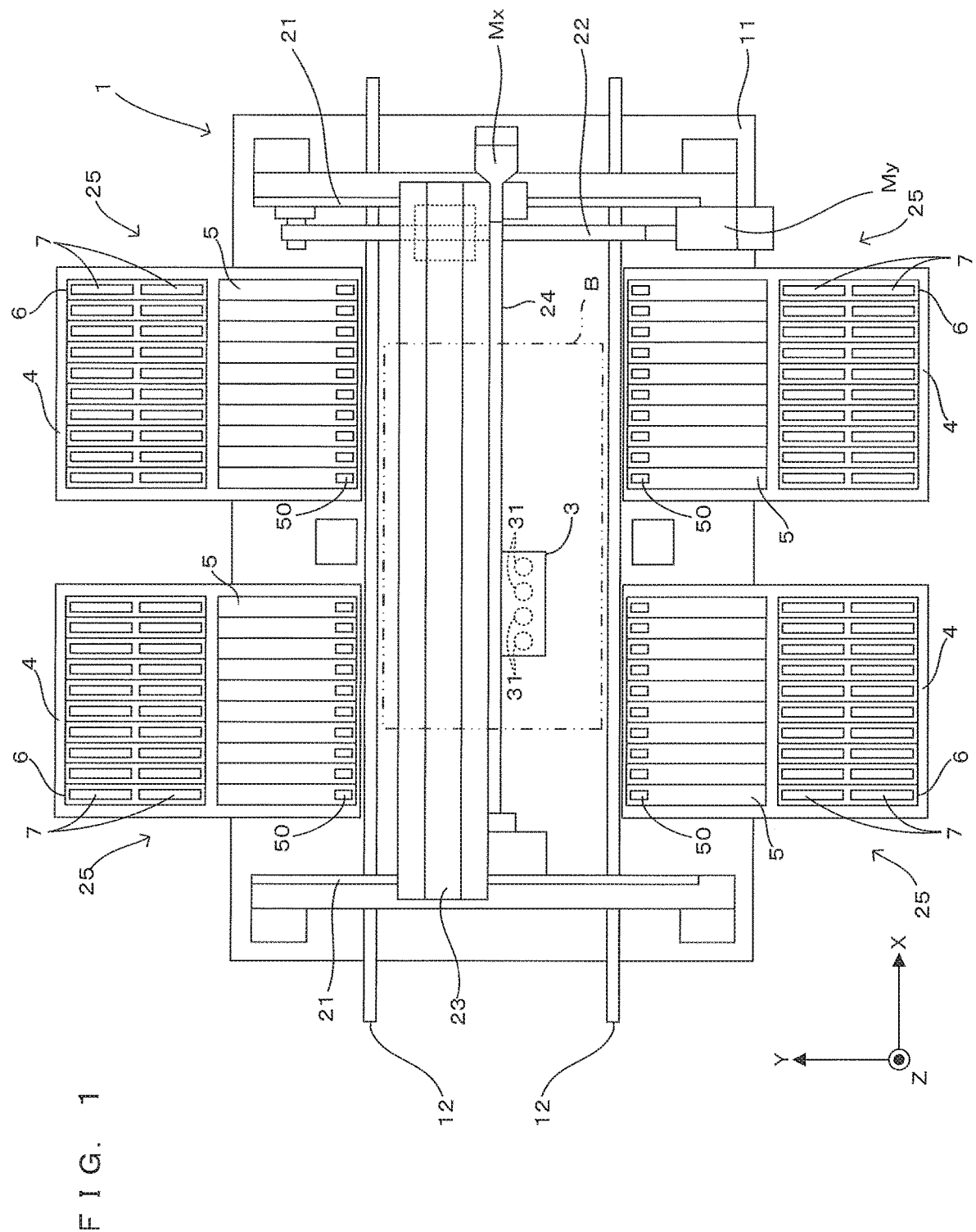
F I G. 1

USE HISTORY INFORMATION H

| REEL ID | COMPONENT REMAINING NUMBER | FEEDER IN USE | LOCATION |
|---------|---------------------------|---------------|----------|
| ... | ... | ... | ... |
| ... | ... | ... | ... |
| ... | ... | ... | ... |
| ... | ... | ... | ... |
| ... | ... | ... | ... |
| ... | ... | ... | ... |
| | | | |

FIG. 5

COMPONENT REPLENISHMENT MANAGEMENT APPARATUS, COMPONENT MOUNTING SYSTEM AND COMPONENT REPLENISHMENT MANAGEMENT METHOD

CROSS-REFERENCE TO RELATED APPLICATION

This application is a National Stage of International Patent Application No. PCT/JP2018/013621, filed Mar. 30, 2018, the entire contents of which is incorporated herein by reference.

BACKGROUND

Technical Field

This disclosure relates to a technique for managing the replenishment of components to a feeder which supplies a component to be mounted on a board from a component storage member.

Background Art

Conventionally, feeders which supplies components stored in component storage members such as supply reels are used to produce a components-mounted board by mounting components on a board. In a configuration in which the components are supplied from the component storage members by the feeders, as described in JP2011-204824, it is necessary to perform a replenishment operation of newly attaching a component supply member and replenishing components to the feeder having used up the components of the component storage member.

SUMMARY

Such a replenishment operation is performed by an operator. In contrast, a plurality of feeders are generally used to produce components-mounted boards. Thus, the replenishment operation is frequently performed to increase a burden of the operator. Therefore, there is a demand to suppress a frequency of the replenishment operation by replenishing many components in one replenishment operation in terms of reducing the burden of the operator. However, it is not rational to replenish components excessive for production planning of components-mounted boards.

Accordingly, this disclosure provides a technique capable of replenishing a number of components suitable for production planning of components-mounted boards while suppressing a frequency of a component replenishment operation.

A component replenishment management apparatus according to the disclosure comprises an obtaining unit which obtains a production planning to produce components-mounted boards by mounting components on boards using Nt feeders, each of the Nt feeders performing a component supply operation of using sequentially a plurality of attached component storage members to supply components from the component storage members, Nt being an integer equal to or greater than 2; and a predicting unit which predicts an attachment possible period for each of the Nt feeders, the attachment possible period being a period until a total remaining component number, which is a total number of the components remaining in the plurality of component storage members, decreases to a predetermined number after the components of one component storage member used first, out of the plurality of component storage members, are used up. The component replenishment management apparatus further comprises a setting unit which set a first reference time so that the first reference time overlaps the attachment possible periods for Nc candidate feeders out of the Nt feeders, the first reference time indicating a timing of an attachment operation of attaching another component storage member storing the components after the components of the one component storage member are used up, Nc being an integer equal to or greater than 2 and equal to or smaller than Nt; and a determining unit which determines an execution mode of the attachment operation for the candidate feeder corresponding to the first reference time based on a number of the components planned to be supplied by the candidate feeder in accordance with the production planning.

A component replenishment management method according to the disclosure comprises obtaining a production planning to produce components-mounted boards by mounting components on boards using Nt feeders, each of the Nt feeders performing a component supply operation of using sequentially a plurality of attached component storage members to supply components from the component storage members, Nt being an integer equal to or greater than 2; and predicting an attachment possible period for each of the Nt feeders, the attachment possible period being a period until a total remaining component number, which is a total number of the components remaining in the plurality of component storage members, decreases to a predetermined number after the components of one component storage member used first, out of the plurality of component storage members, are used up. The method further comprises setting a first reference time so that the first reference time overlaps the attachment possible periods for Nc candidate feeders out of the Nt feeders, the first reference time indicating a timing of an attachment operation of attaching another component storage member storing the components after the components of the one component storage member are used up, Nc being an integer equal to or greater than 2 and equal to or smaller than Nt; and determining an execution mode of the attachment operation for the candidate feeder corresponding to the first reference time based on a number of the components planned to be supplied by the candidate feeder in accordance with the production planning.

According to the disclosure (component replenishment management apparatus, component replenishment management method) thus configured, the attachment possible period during which the attachment operation of the component storage member can be performed is predicted for each of the Nt feeders (Nt is an integer equal to or greater than 2), and the first reference time indicating the timing of the attachment operation is set to overlap the attachment possible periods for the Nc candidate feeders, out of the Nt feeders. Thus, the attachment operations can be collectively performed for the Nc candidate feeders by one replenishment operation (Nc is an integer equal to or greater than 2 and equal to or smaller than Nt), and a frequency of a component replenishment operation of an operator can be suppressed. Further, the execution mode of the attachment operation for the candidate feeder corresponding to the first reference time is determined based on a number of the components planned to be supplied in accordance with the production planning by the candidate feeder. Therefore, a number of the components suitable for the production planning of the components-mounted boards can be replenished. In this way, in the disclosure, a number of the components suitable for the production planning of the components-mounted boards can be replenished while the frequency of the component replenishment operation is suppressed.

The component replenishment management apparatus may be configured so that the determining unit judges for the candidate feeders whether or not the total remaining component number at the first reference time is sufficient for a number of the components planned to be supplied from the first reference time to an end of the production planning, determines to perform the attachment operation according to the first reference time for the candidate feeder judged to have an insufficient total remaining component number, out of the Nc candidate feeders, and determines not to perform the attachment operation according to the first reference time for the candidate feeder judged to have a sufficient total remaining component number. In such a configuration, the occurrence of component storage member attachment operations excessive for the production planning is suppressed and the frequency of the component replenishment operation can be effectively suppressed.

At a production site of the components-mounted boards, all the components of the component supply members are not necessarily used up in every board production, and used component supply members having the components partially used are possibly present. As a result, a plurality of the component supply members including new and used ones may be usable in the attachment operations for the candidate feeders.

The component replenishment management apparatus may be configured so that the determining unit determines to use one component storage member in the attachment operation if a plurality of target storage members having different component storage numbers are present as another component storage member usable in the attachment operation for the candidate feeder as an execution target of the attachment operation according to the first reference time, the one component storage member is selected from the plurality of target storage members by the determining unit based on a number of the components planned to be supplied after the first reference time in accordance with the production planning By such a configuration, a number of the components suitable for the production planning of the components-mounted boards can be replenished while the used component storage members are efficiently used.

The component replenishment management apparatus may be configured so that the determining unit determines to use one target storage member, which is selected from the plurality of target storage members based on a first necessary number which is a number of the components planned to be supplied from the first reference time to an end of the production planning in accordance with the production planning, in the attachment operation. In such a configuration, a suitable number of the components necessary to end the production planning can be replenished while the used component storage members are efficiently used.

The component replenishment management apparatus may be configures so that the determining unit selects the target storage member having a smallest component storage number, out of the target storage members which are assumed to make the total remaining component number equal to or greater than the first necessary number when being attached at the first reference time, as the one target storage member. In such a configuration, the used component storage members can be efficiently used in an ascending order from the one having a smallest component storage number.

The component replenishment management apparatus may be configures so that the determining unit selects the target storage member having a greatest component storage number, out of the plurality of target storage members, as the one target storage member if there is no target storage member assumed to make the total remaining component number equal to or greater than the first necessary number when being attached at the first reference time. In such a configuration, even a case where there is no suitable used component storage member can be properly dealt with.

The component replenishment management apparatus may be configured so that the setting unit sets a second reference time indicating a timing of the attachment operation coming next to the first reference time, and the determining unit determines to use one target storage member, which is selected from the plurality of target storage members based on a number of the components planned to be supplied from the first reference time to the second reference time in accordance with the production planning, in the attachment operation. In such a configuration, a suitable number of the components necessary until the attachment operation is performed according to the second reference time after the attachment operation is performed according to the first reference time can be replenished while the used component storage members are efficiently used.

The component replenishment management apparatus may be configured so that the determining unit determines to use one target storage member, which is selected from the plurality of target storage members based on a second necessary number which is a sum of the number of the components planned to be supplied from the first reference time to the second reference time and the predetermined number, in the attachment operation. By this configuration, a suitable number of the components can be replenished so that the attachment possible period does not elapse before the second reference time.

The component replenishment management apparatus may be configured so that the determining unit selects the target storage member having a smallest component storage number, out of the target storage members which are assumed to make the total remaining component number greater than the second necessary number when being attached at the first reference time, as the one target storage member. In such a configuration, the used component storage members can be efficiently used in an ascending order from the one having a smallest component storage number.

The component replenishment management apparatus may be configured so that the determining unit determines to perform the attachment operation while switching the component storage member used in the component supply operation to another component storage member if the component storage number of another component storage member is smaller than the component storage number of the component storage member being used in the component supply operation at the first reference time. In such a configuration, a long attachment possible period coming next to the attachment operation according to the first reference time can be ensured, and spare time usable for the attachment operation to be performed according to the attachment possible period can be created.

A component mounting system according to the disclosure, comprises: a component mounting apparatus which performs a production planning to produce components-mounted boards by mounting components on boards using Nt feeders, each of the Nt feeders performing a component supply operation of using sequentially a plurality of attached component storage members to supply components from the component storage members, Nt being an integer equal to or greater than 2; and the component replenishment management apparatus. Therefore, in the disclosure, a number of the components suitable for the production planning of components-mounted boards can be replenished while the frequency of the component replenishment operation is suppressed.

According to the disclosure, a number of the components suitable for the production planning of components-mounted boards can be replenished while the frequency of the component replenishment operation is suppressed.

BRIEF DESCRIPTION OF THE DRAWINGS

FIG. 1 is a plan view schematically showing a component mounting apparatus, which is an example of a management target by a component supply management apparatus according to the disclosure;

FIG. 5 is a table schematically showing an example of the use history information of the component supply reels;

DETAILED DESCRIPTION

Figure 2:
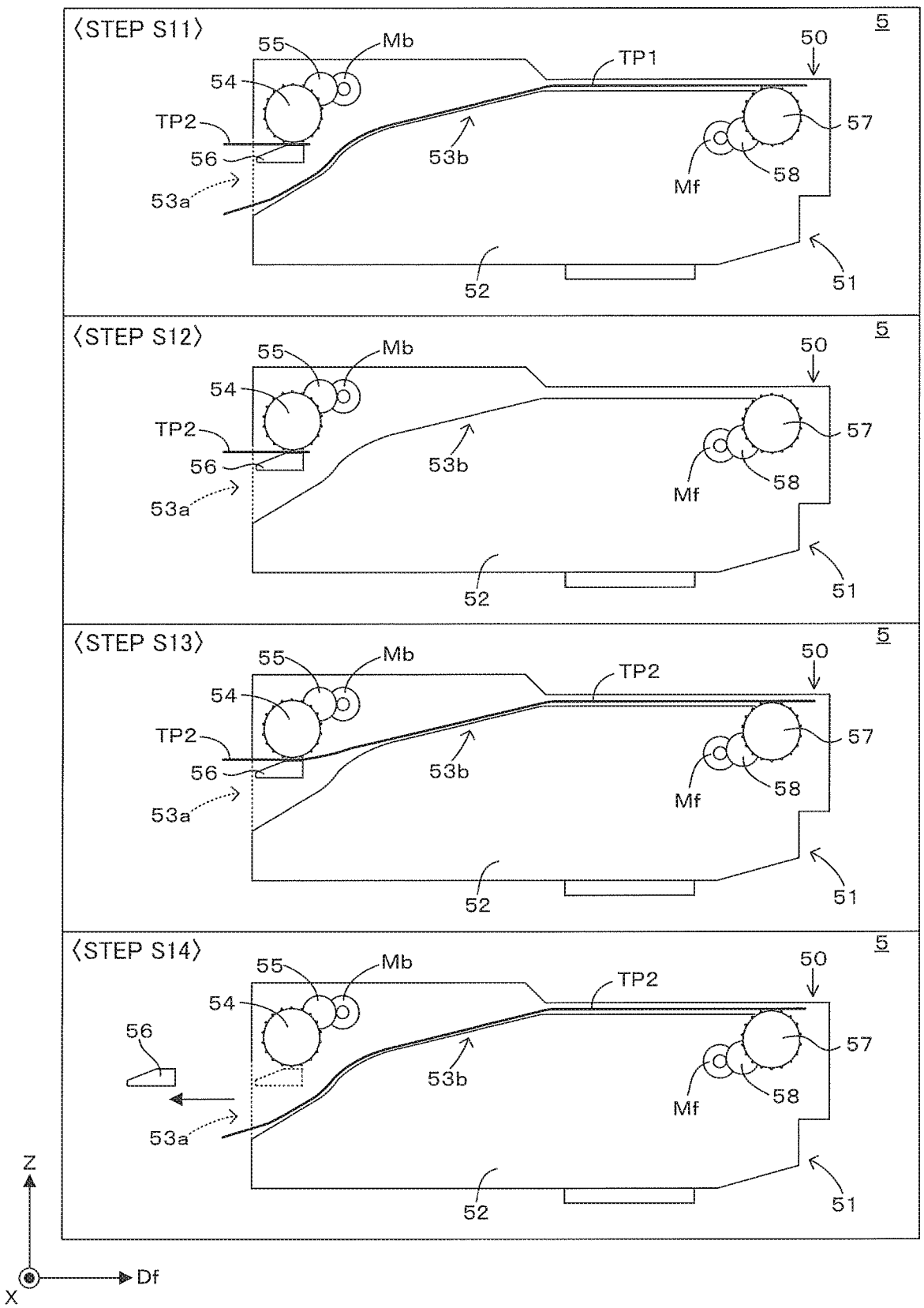
FIG. 2 is side views schematically showing examples of the configuration and operation of the tape feeder.

FIG. 1 is a plan view schematically showing a component mounting apparatus, which is an example of a management target by a component supply management apparatus according to the disclosure. In FIG. 1, an XYZ Cartesian coordinate system composed of a Z direction parallel to a vertical direction and X and Y directions respectively parallel to a horizontal direction is shown. This component mounting apparatus 1 includes a pair of conveyors 12, 12 provided on a base 11. The component mounting apparatus 1 mounts components on a board B carried into an operating position (position of the board B of FIG. 1) from an upstream side in the X direction (board conveying direction) by the conveyors 12 and carries out the board B finished with component mounting to a downstream side in the X direction from the operating position by the conveyors 12.

A pair of Y-axis rails 21, 21 extending in the Y direction, a Y-axis ball screw 22 extending in the Y direction and a Y-axis motor My for rotationally driving the Y-axis ball screw 22 are provided in the component mounting apparatus 1, and a head supporting member 23 is fixed to a nut of the Y-axis ball screw 22 while being supported on the pair of Y-axis rails 21, 21 movably in the Y direction. An X-axis ball screw 24 extending in the X direction and an X-axis motor Mx for rotationally driving the X-axis ball screw 24 are mounted on the head supporting member 23, and a head unit 3 is fixed to a nut of the X-axis ball screw 24 while being supported on the head supporting member 23 movably in the X direction. Thus, the head unit 3 can be moved in the Y direction by rotating the Y-axis ball screw 22 by the Y-axis motor My or can be moved in the X direction by rotating the X-axis ball screw 24 by the X-axis motor Mx.

Two component supply units 25 are arranged in the X direction on each of both sides of the pair of conveyors 12, 12 in the Y direction, and a feeder mounting carriage 4 is detachably attached to each component supply unit 25. A plurality of tape feeders 5 arranged in the X direction and a plurality of reel holders 6 arranged in the X direction are detachably mounted on this feeder mounting carriage 4, and one tape feeder 5 and one reel holder 6 are arranged in the Y direction to correspond to each other.

Component supply reels 7 held on each reel holder 6 has component supply tapes TP each storing components (chip electronic components) in the form of small pieces such as integrated circuits, transistors and capacitors at predetermined intervals. This component supply tape TP includes a carrier tape for storing components in each of a plurality of pockets aligned in a row at equal intervals and a cover tape for covering the components in the pockets by being adhered to the carrier tape. A plurality of engaging holes aligned at given intervals along an edge penetrate through one side of the carrier tape TP. As described later, two carrier tapes TP can be attached in each tape feeder 5 and, correspondingly, each reel holder 6 holds two component supply reels 7 arranged in the Y direction. Each tape feeder 5 supplies the components in the carrier tape TP to a predetermined component supply position 50 by intermittently feeding the carrier tape TP pulled out from the component supply reel 7 adjacent in the Y direction toward the head unit 3 (component supply operation).

The head unit 3 includes a plurality of (four) mounting heads 31 arranged in the X direction. Each mounting head 31 has an elongated shape extending in the Z direction (vertical direction) and can suck/hold the component by a nozzle disengageably attached to the lower end thereof. That is, the mounting head 31 moves to a position above the tape feeder 5 and sucks the component supplied by the tape feeder 5. Subsequently, the mounting head 31 moves to a position above the board B at the operating position and releases the suction of component, thereby mounting the component on the board B. In this way, the mounting head 31 performs component mounting by taking out the component supplied to the component supply position 50 by the tape feeder 5 from the carrier tape TP and mounting the component on the board B.

FIG. 2 is side views schematically showing examples of the configuration and operation of the tape feeder. In FIG. 2 and subsequent figures, a feeding direction Df (parallel to the Y direction) in which the tape feeder 5 feeds the carrier tape TP is shown as appropriate and an arrow side in the feeding direction Df is defined as a "front side" in the feeding direction Df and a side opposite to the arrow side in the feeding direction Df is defined as a "rear side" in the feeding direction Df. Further, to distinguish the two carrier tapes TP attachable to the tape feeder 5, different reference signs TP1, TP2 are used for the carrier tapes as appropriate in FIG. 2 and subsequent figures.

The tape feeder 5 includes a feeder body 51 having a mechanical configuration and motors Mf, Mb which drive the feeder body 51. The feeder body 51 includes a flat case 52 thin in the X direction and long in the feeding direction Df. A tape insertion opening 53a (shown by a broken line) extending in the Z direction is open in the rear end of the case 52 in the feeding direction Df, and the aforementioned component supply position 50 is provided on the upper surface of a front part of the case 52 in the feeding direction Df. A tape conveyance path 53b extending from the tape insertion opening 53a to the component supply position 50 is provided in the feeder body 51. This feeder body 51 supplies the component to the component supply position 50 by feeding the carrier tape TP inserted into the tape conveyance path 53b from the tape insertion opening 53a in the feeding direction Df by receiving a drive force of the motor Mf, Mb.

Specifically, the feeder body 51 includes a sprocket 54 arranged above the tape conveyance path 53b and adjacent to the tape insertion opening 53a and a gear 55 which transmits the drive force of the motor Mb to the sprocket 54 in the case 52, and the sprocket 54 rotates upon receiving the drive force generated by the motor Mb. The feeder body 51 further includes a tape supporting member 56 detachably attached to the case 52. This tape supporting member 56 faces the sprocket 54 from below and sandwiches the carrier tape TP between the tape supporting member 56 and the sprocket 54, thereby engaging the carrier tape TP with the sprocket 54. In this way, the sprocket 54 can feed the carrier tape TP in the feeding direction Df by rotating while being engaged with the carrier tape TP. Further, the feeder body 51 includes a sprocket 57 arranged in a front end part and adjacent to the tape conveyance path 53b from below and a gear 58 which transmits the drive force of the motor Mf to the sprocket 57 in the case 52, and the sprocket 57 rotates upon receiving the drive force generated by the motor Mf. Therefore, the sprocket 57 can intermittently convey the carrier tape TP in the feeding direction DF by intermittently rotating while being engaged with the carrier tape TP.

Further, the feeder body 51 includes a cutter in contact with the component supply tape TP on a side upstream of the component supply position 50 in the feeding direction Df. This cutter exposes the component supplied to the component supply position 50 by cutting the cover tape of the component supply tape TP intermittently conveyed in the feeding direction Df in a center and turning over the cut parts toward both sides. A configuration for exposing the component in this way is, for example, similar to that described in JP 2015-053320A.

Step S11 corresponds to a state where the tape feeder 5 is used in component mounting by the mounting head 31. That is, the carrier tape TP1 is inserted along the tape conveyance path 53b to the feeder body 51, and the sprocket 57 supplies the component to be mounted on the board B to the component supply position 50 by intermittently conveying the carrier tape TP1 in the feeding direction Df. Further, in Step S11, the leading end of the carrier tape TP2 to be used in component mounting next to the carrier tape TP1 is attached between the sprocket 54 and the tape supporting member 56. In this way, the carrier tape TP2 to be used next waits on standby in a rear end part of the feeder body 51.

If the components in the carrier tape TP1 are used up and the tape feeder 5 discharges the carrier tape TP1 as shown in Step S12, loading shown in Step S13 is performed. Specifically, the sprocket 54 starts to rotate, feeds the carrier tape TP2 toward the component supply position 50 in the feeding direction Df and engages the leading end of the carrier tape TP2 with the sprocket 57. Subsequently, if the operator performs an operation of removing the tape supporting member 56 from the case 52 in Step S14, the carrier tape TP2 is separated from the sprocket 54 and drops to the tape conveyance path 53b. In this way, the sprocket 57 can supply the components in the carrier tape TP2 to the component supply position 50 by intermittently conveying the carrier tape TP2 in the feeding direction Df. Incidentally, the operator can attach the carrier tape TP to be used in component mounting next to the carrier tape TP2 between the sprocket 54 and the tape supporting member 56 and cause the carrier tape TP to wait on standby by attaching the tape supporting member 56 to the case 52 again after Step S14.

In the component mounting apparatus 1 using such a tape feeder 5, the carrier tape TP being used is inserted into the feeder body 51 along the tape conveyance path 53b, whereas the carrier tape TP to be used next waits on standby above the tape conveyance path 53b. By performing Steps S12 to S14 every time the carrier tape TP is used up, the carrier tape TP waiting on standby can be inserted into the feeder body 51 along the tape conveyance path 53b and used next.

Figure 3:
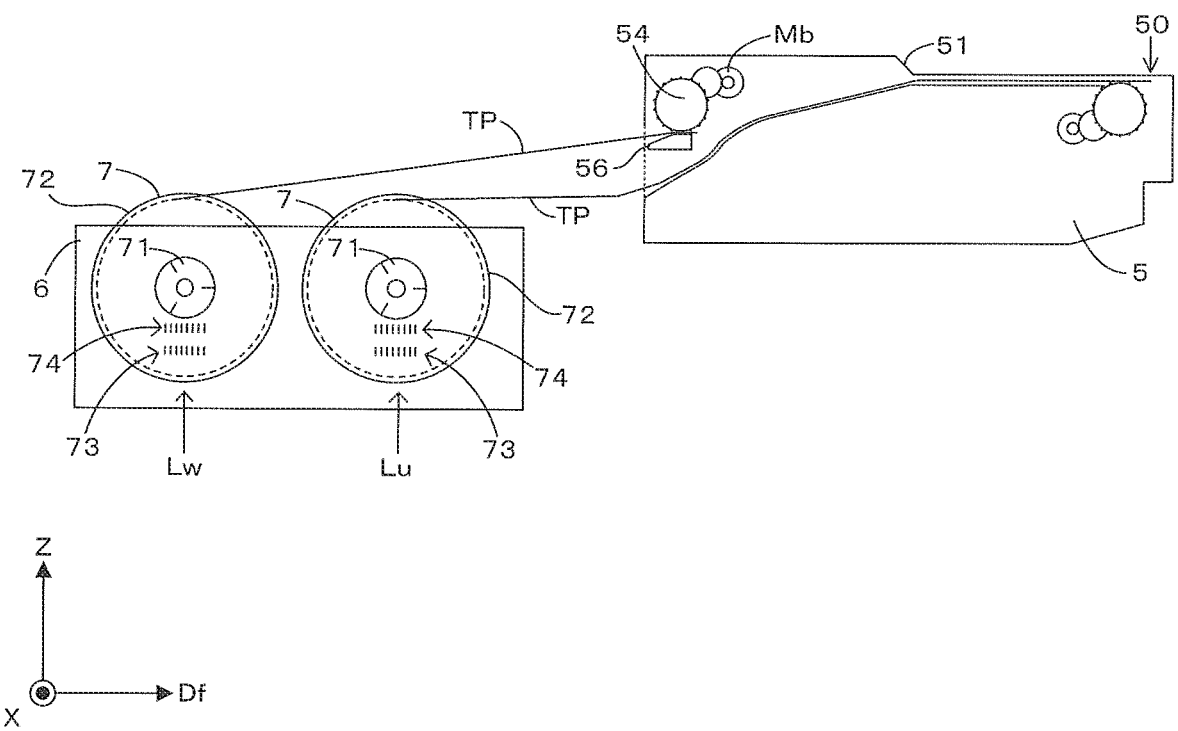
FIG. 3 is a view schematically showing an example of the component supply reels and the reel holder holding these component supply reels.

FIG. 3 is a view schematically showing an example of the component supply reels and the reel holder holding these component supply reels. In FIG. 3, the component supply reels 7 are shown by showing the reel holder 6 in a transparent manner. The component supply reel 7 includes a shaft center 71 and two side plates 72 sandwiching the shaft center 71 from both sides, and supports the component supply tape TP wound on the shaft center 71 from the both sides by the side plates 72. Further, the reel 7 includes a reel ID 73 and a component ID 74 respectively constituted by barcodes on the side plate 72. The reel ID 73 is unique and can be used to individually distinguish the component supply reel 7 having the reel ID 73 attached thereto. The component ID 74 indicates information (type and number of components, expiration date and the like) on the components stored in the component supply tape TP of the component supply reel 7 having the component ID 74 attached thereto. Note that the reel ID 73 and the component ID 74 need not necessarily be constituted by separate barcodes and may be constituted by one barcode.

The reel holder 6 can hold the component supply reels 7 at a use position Lu and a standby position Lw behind the use position Lu in the feeding direction Df. The component supply tape TP of the component supply reel 7 held at the use position Lu is loaded and used to supply the components in component mounting, whereas the component supply tape TP of the component supply reel 7 held at the standby position Lw is attached between the sprocket 54 of the tape feeder 5 and the tape supporting member 56. In this way, two component supply reels 7 can be attached to one tape feeder 5. Note that the attachment of the component supply reel 7 to the tape feeder 5 means the mounting the leading end of the component supply tape TP pulled out from the component supply reel 7 arranged in the reel holder 6 to the tape feeder 5.

In such a configuration, if the component supply tape TP of the component supply reel 7 arranged at the use position Lu, out of the two component supply reels 7 attached to the tape feeder 5, is used up, the component supply tape TP of the component supply reel 7 arranged at the standby position Lw is loaded and used in component mounting. After one of the two component supply reels 7 is used up in this way, the operator can attach another component supply reel 7 supplied from a component storage cabinet 81 to the tape feeder 5 and cause this component supply reel 7 to wait on standby. Specifically, the operator can attach another component supply reel 7 to the tape feeder 5 (attachment operation) by sequentially performing the following procedures:

Remove the component supply reel 7 having the components thereof used up from the use position Lu.

Move the component supply reel 7 to be used in component mounting from the standby position Lw to the use position Lu.

Arrange another component supply reel 7 at the standby position Lw.

Attach the leading end of the component supply tape TP pulled out from this another component supply reel 7 between the sprocket 54 and the tape supporting member 56.

Figure 4:
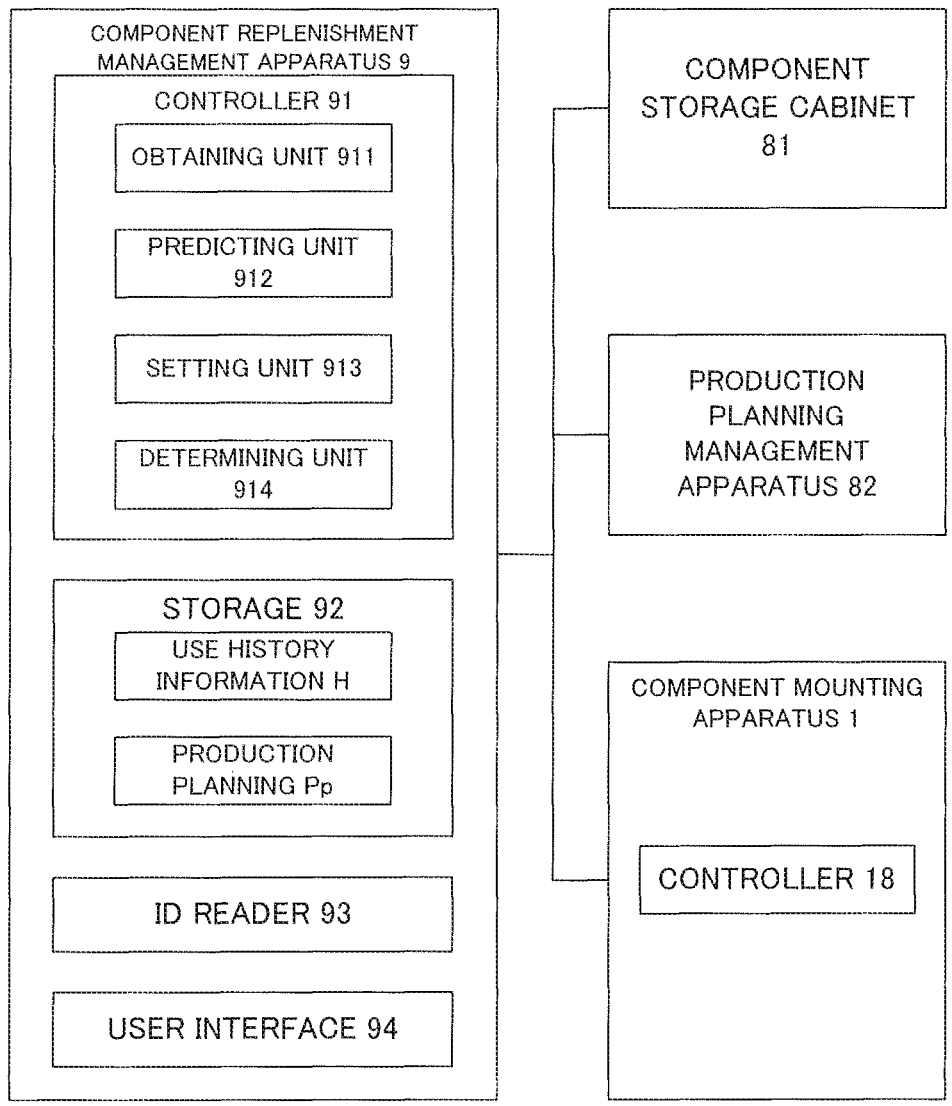
FIG. 4 is a block diagram showing an example of a component mounting system according to the disclosure.

FIG. 4 is a block diagram showing an example of a component mounting system according to the disclosure. This component mounting system 100 includes the component mounting apparatus 1, the component storage cabinet 81 which stores the component supply reels 7 to be used in the component mounting apparatus 1, a production planning management apparatus 82 which manages component mounting in the component mounting apparatus 1, and a component replenishment management apparatus 9 which manages the replenishment of components to the component mounting apparatus 1.

The component storage cabinet 81 stores a multitude of component supply reels 7 respectively at determined storage locations. This component storage cabinet 81 includes a supply port for supplying the component supply reels 7 and a return port for receiving the component supply reels 7. The component storage cabinet 81 discharges the component supply reel 7 from the storage location thereof to the supply port in accordance with a request from the component replenishment management apparatus 9 or an operator and stores the component supply reel 7 returned to the return port by the operator at the storage location of that component supply reel 7.

The production planning management apparatus 82 is a server computer and manages the component mounting apparatus 1 based on production planning Pp for producing components-mounted boards by mounting components on boards B. Specifically, the production planning management apparatus 82 generates board data representing a procedure of mounting the components on the board B based on the production planning Pp and transmits the board data to the component mounting apparatus 1. Then, the component mounting apparatus 1 mounts the components on the board B in the procedure represented by the received board data.

The component replenishment management apparatus 9 is a server computer and includes a controller 91, a storage 92, an ID reader 93, a user interface 94 and the like. The controller 91 is a processor composed of a CPU (Central Processing Unit), a RAM (Random Access Memory) and a ROM (Read Only Memory) and constructs an obtaining unit 911, a predicting unit 912, a setting unit 913 and a determining unit 914 inside by implementing a predetermined component replenishment management program. Operations of these units are described in detail later.

The storage 92 is an HDD (Hard Disk Drive) and stores the production planning Pp obtained from the production planning management apparatus 82. Further, the storage 92 stores use history information H (FIG. 5) associating use histories of the component supply reels 7 with the reel IDs 73 of the component supply reels 7. Here, FIG. 5 is a table schematically showing an example of the use history information of the component supply reels. As shown in FIG. 5, remaining numbers of the components stored in the component supply reels 7, the types of the tape feeders (feeders in use) for which the component supply reels 7 were used and the locations of the component supply reels 7 are associated with the reel IDs 73.

Specifically, the types of the tape feeders are managed based on differences of component exposure methods. That is, there exist at least two types of component exposure methods including a method for cutting and opening the cover tape as described above and a method for collecting the cover tape to a collection mechanism while peeling the cover tape from the carrier tape as described in JP 2017-143225A. Accordingly, the type of the tape feeder for which the component supply reel 7 was used is associated with the reel ID 73 of the component supply reel 7.

Further, there exit two types of locations as the locations of the component supply reels 7. That is, an attached location of this component supply reel 7 on the feeder mounting carriage 4 is associated with the reel ID 73 if the target component supply reel 7 is attached in the component supply unit 25, and the storage location of this component supply reel 7 is associated with the reel ID 73 if the target component supply reel 7 is stored in the component storage cabinet 81.

Referring back to FIG. 4, the description is continued. The ID reader 93 is a barcode reader and used to read the reel ID 73 and the component ID 74 attached to the component supply reel 7. Note that the ID reader 93 may be of a portable type to carry out radio communication with the controller 91 or may be of a type to carry out wired communication with the controller 91. Further, the user interface 94 is constituted, for example, by a touch panel display, a speaker and the like, and receives an input operation from an operator or notifies the operator. Particularly, the user interface 94 functions to display the use history information H of FIG. 5.

Further, the component mounting apparatus 1 includes a controller 18 besides the mechanical configuration shown in FIG. 1. The controller 18 is a processor constituted by a CPU, a RAM and a ROM and controls to perform the component mounting on the board B in a procedure represented by the board data received from the production planning management apparatus 82. Particularly, this controller 18 also functions to manage a remaining number of the components in the component supply reels 7 attached to the tape feeder 5.

Figure 6:
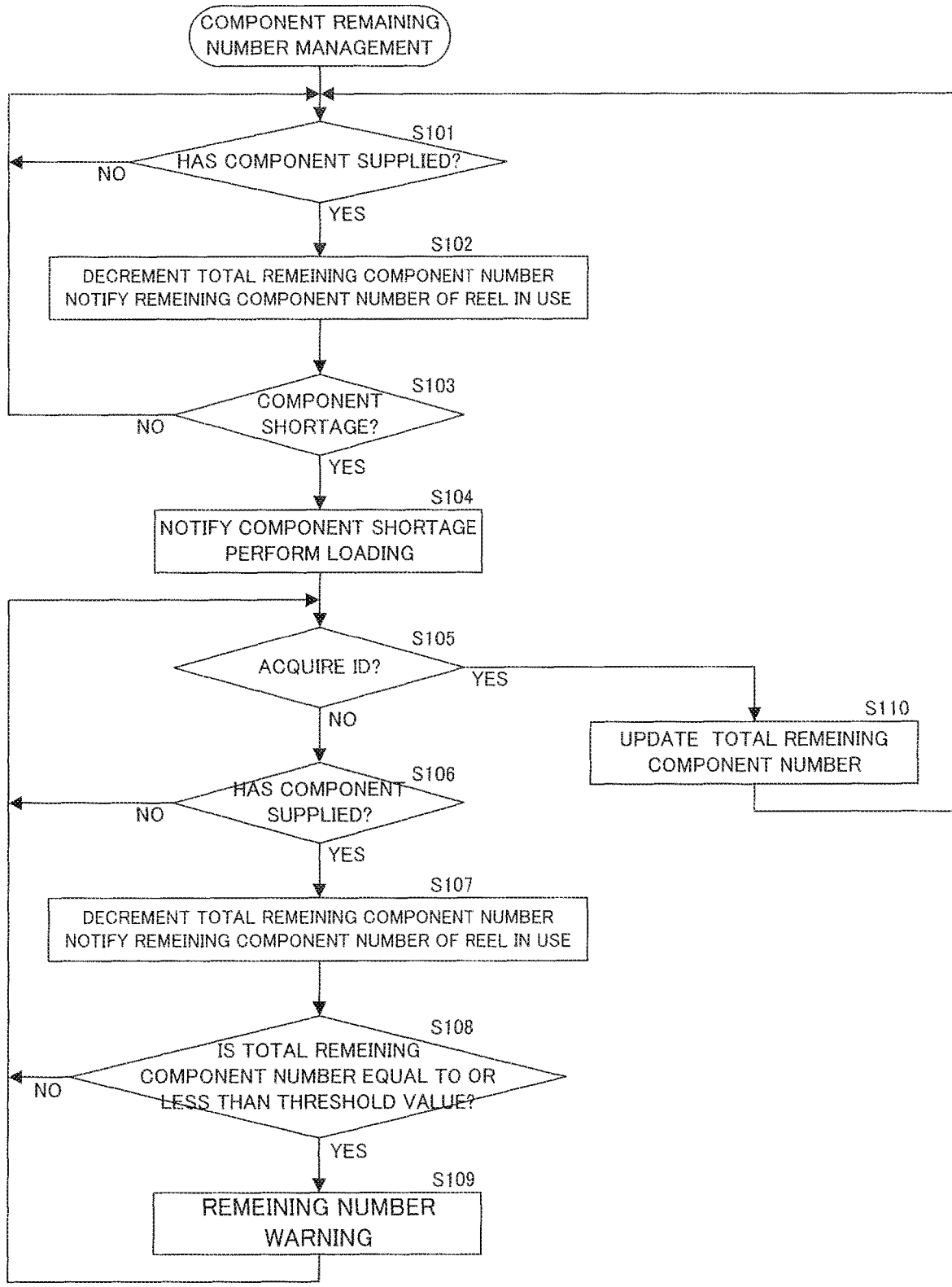
FIG. 6 is a flow chart showing an example of a component remaining number management performed by the controller of the component mounting apparatus.

FIG. 6 is a flow chart showing an example of a component remaining number management performed by the controller of the component mounting apparatus. This flow chart manages a total remaining component number, which is a total number of the components remaining in the two component supply reels 7 attached to the tape feeder 5 (a total number of the components held in the reel holder 6 corresponding to the tape feeder 5) and a remaining component number of the component supply reel 7 arranged at the use position Lu and is performed for each tape feeder 5 in parallel to the component mounting. In Step S101, it is confirmed whether or not the tape feeder 5 has supplied the component to the component supply position 50. If the supply of the component is confirmed ("YES" in Step S101), the total remaining component number is decremented (Step S102). Further, in Step S102, the remaining component number of the component supply reel 7 used to supply the component by the tape feeder 5 is notified together with the reel ID 73 of this component supply reel 7 to the component replenishment management apparatus 9, and the component replenishment management apparatus 9 updates the remaining component number associated with this reel ID 73 in the use history information H.

In Step S103, it is confirmed whether or not the components of the component supply reel 7 being used to supply the components, out of the two component supply reels 7, have been used up. If the components are not used up and a component shortage has not occurred ("NO" in Step S103), return is made to Step S101. Note that whether or not the components have been used up can be judged based on appropriate criteria. For example, if the suction/holding of the component cannot be confirmed in performing an operation of sucking the component supplied by the tape feeder 5, the occurrence of a suction error is judged. Accordingly, if it is confirmed that a plurality of suction errors have successively occurred, it can be judged that the components have been used up. Alternatively, if it is confirmed that the remaining component number of the component supply reel 7 arranged at the use position Lu has become zero, it can be judged that the components have been used up. On the other hand, if the component shortage has occurred ("YES" in Step S103), the controller 18 notifies the occurrence of the component shortage to the controller 91 of the component replenishment management apparatus 9 (Step S104) and the controller 91 notifies the operator by the user interface 94 to perform the attachment operation. Further, in Step S104, the controller 18 causes the tape feeder 5 to perform the loading of Steps S12 to S13 of FIG. 2, and the next component supply reel 7 is used to supply the components.

In Step S105, it can be grasped whether or not the attachment operation of the component supply reel 7 has been performed by the operator by confirming the acquisition of the reel ID 73 and the component ID 74 (hereinafter, referred to as the "reel ID 73 and the like" as appropriate) of the newly attached component supply reel 7. That is, the operator attaches the component supply reel 7 to the tape feeder 5 (attachment operation) after reading the reel ID 73 and the like of the component supply reel 7 by the ID reader 93. At this time, the reel ID 73 and the like are transmitted from the component replenishment management apparatus 9 to the controller 18 of the component mounting apparatus 1.

The controller 18 confirms whether or not the tape feeder 5 has supplied the component to the component supply position 50 (Step S106) if the acquisition of the reel ID 73 and the like cannot be confirmed ("NO" in Step S105). If the supply of the component is not confirmed ("NO" in Step S106), return is made to Step S105. If the supply of the component is confirmed ("YES" in Step S106), the total remaining component number is decremented (Step S107). Further, in Step S107, the remaining component number of the component supply reel 7 used to supply the component by the tape feeder 5 is notified together with the reel ID 73 of this component supply reel 7 to the component replenishment management apparatus 9 and the component replenishment management apparatus 9 updates the remaining component number associated with this reel ID 73 in the use history information H.

In Step S108, it is confirmed whether or not the total remaining component number has become equal to or smaller than a threshold value (here, the threshold value is an integer equal to or greater than 1). If the total remaining component number is greater than the threshold value ("NO" in Step S108), return is made to Step S105. On the other hand, if the total remaining component number is equal to or smaller than the threshold value ("YES" in Step S108), the controller 18 notifies the controller 91 of the component replenishment management apparatus 9 to give a remaining number warning (Step S109) and return is made to Step S105. Upon receiving the notification in Step S109, the controller 91 performs the remaining number warning by the user interface 94. Note that this remaining number warning is given to request the operator to immediately perform the attachment operation since the total remaining component number for the target tape feeder 5 is small.

If the acquisition of the reel ID 73 and the like is confirmed in Step S105 ("YES" in Step S105), the total remaining component number is updated (Step S110). Specifically, the total remaining component number is updated by obtaining the remaining component number represented by the use history information H for the reel ID 73 from the component replenishment management apparatus 9 and adding this remaining component number. Then, return is made to Step S101. At this time, if the acquisition of the reel ID 73 and the like is confirmed in a situation where the remaining number warning is being given, the remaining number warning is released as the total remaining component number is updated. These Steps S101 to S110 are performed until the use of the tape feeder 5 in component mounting is finished.

As just described, if the component shortage occurs in the component supply reel 7 as the component mounting is performed in the component mounting apparatus 1, the operator needs to perform the replenishment operation of replenishing the components by the attachment operation of the component supply reel 7. Accordingly, the component replenishment management apparatus 9 sets an execution timing (attachment timing) of the attachment operation to be performed in parallel to the component mounting for the component mounting apparatus 1. Particularly, an attachment time is set so that the attachment operations can be collectively performed for a plurality of the tape feeders 5 by one replenishment operation.

Figure 7:
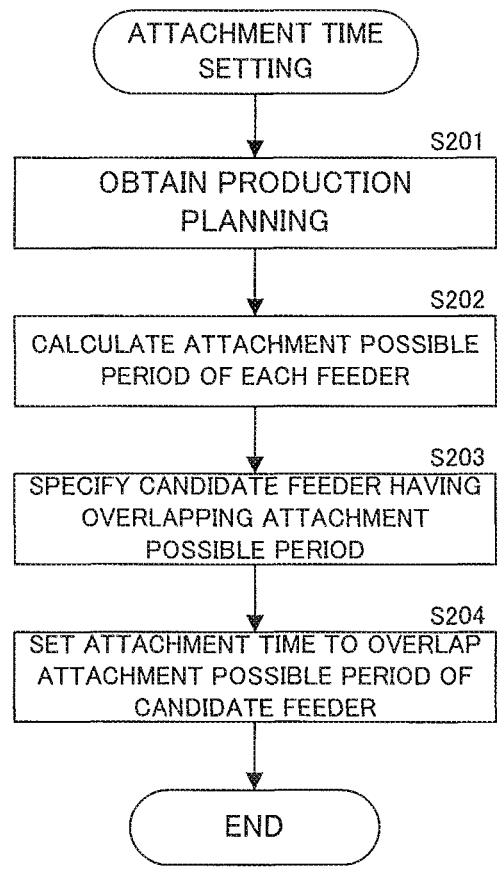
FIG. 7 is a flow chart showing a first example of attachment time setting performed by the component replenishment management apparatus.

FIG. 7 is a flow chart showing a first example of attachment time setting performed by the component replenishment management apparatus. This flow chart is performed by the obtaining unit 911, the predicting unit 912 and the setting unit 913 of the controller 91. In Step S201, the obtaining unit 911 obtains the production planning Pp from the production planning management apparatus 82 and stores it in the storage 92. In Step S202, a period during which the attachment operation can be performed for the tape feeder 5 (attachment possible period) in the case of causing the component mounting apparatus 1 to perform the production planning Pp is predicted for each of the plurality of (Nt) tape feeders attached in the component mounting apparatus 1 by the predicting unit 912 (here, Nt is an integer equal to or greater than 2).

That is, as described with reference to FIG. 3, after one component supply reel 7 precedingly fed by the sprocket 57, out of the two component supply reels 7 attached to the tape feeder 5, is used up, the component supply tape TP from the succeeding component supply reel 7 is automatically engaged with the sprocket 57 and fed to continue the supply of the components. The operator can perform the attachment operation of attaching another component supply reel 7 to the tape feeder 5 while the supply of the components is continued in this way. Thus, a time at which the one of the two component supply reels 7 is used up is calculated as a start time of the attachment possible period. On the other hand, as described with reference to FIG. 6, since the remaining number warning is notified if the total remaining component number becomes equal to or smaller than the threshold value after the one component supply reel 7 is used up, the attachment operation is preferably performed before the notification of this remaining number warning. Therefore, a time at which the total remaining component number becomes the threshold value (i.e. time at which the remaining number warning is notified) is calculated as an end time of the attachment possible period.

Note that a change of the remaining component number of the component supply reel 7 attached to the tape feeder 5 can be predicted based on the use history information H and the production planning Pp. That is, the remaining component number of the components stored when the target component supply reel 7 is attached to the component supply reel 7 (initial remaining component number) can be obtained by referring to the remaining component number associated with the reel ID 73 of this component supply reel 7 in the use history information H. By subtracting the number of times of supplying the components of this component supply reel 7 in the production planning Pp from the initial remaining component number, the remaining component number of this component supply reel 7 can be calculated. Also in flow charts to be described below, the remaining component number of the component supply reel 7 can be similarly calculated by appropriately referring to the use history information H and the production planning Pp.

Figure 8:
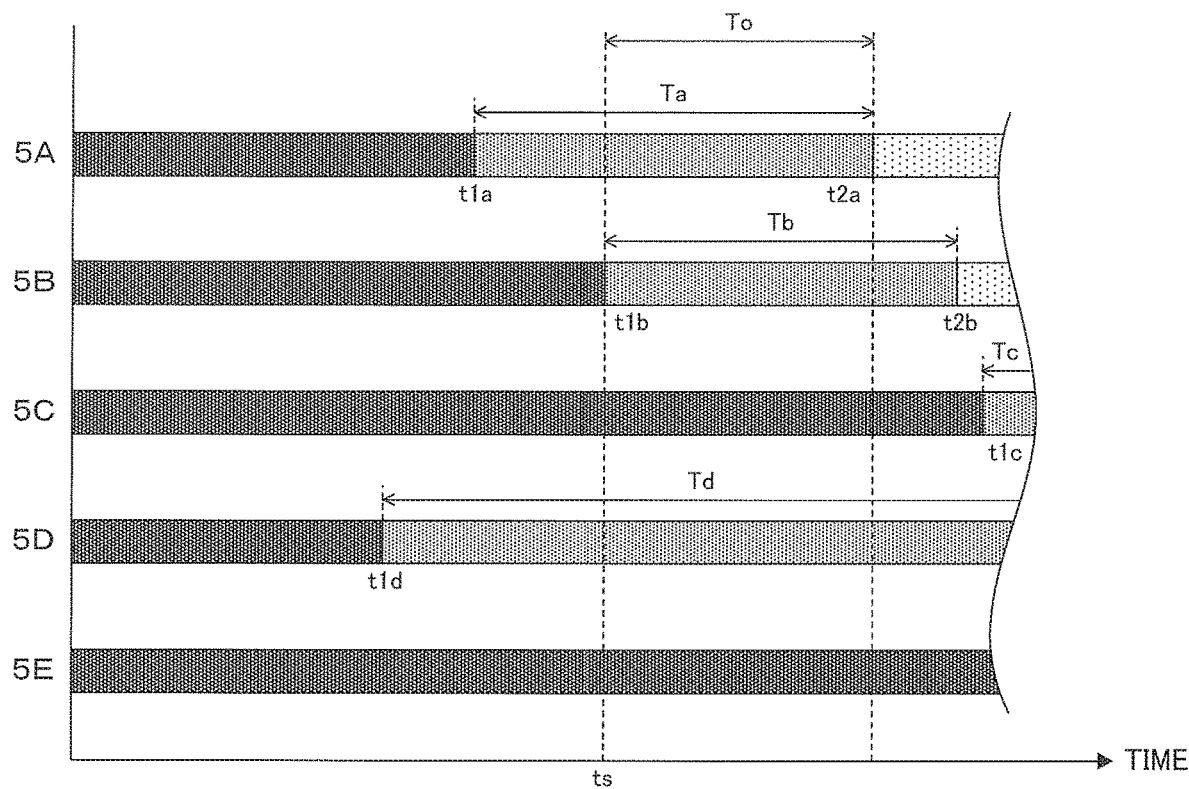
FIG. 8 is a chart showing an example of calculation results of the attachment possible periods performed in accordance with the flow chart of FIG. 7.

FIG. 8 is a chart showing an example of calculation results of the attachment possible periods performed in accordance with the flow chart of FIG. 7. In the example of FIG. 8, attachment time setting examples of five (Nt=5) tape feeders 5A to 5E as targets are shown. However, the number Nt of the target tape feeders 5 is, of course, not limited to five of this example. In FIG. 8, differences in state are shown by the density of hatching. A period with densest hatching is equivalent to a period during which the component shortage occurs in neither one of the two component supply reels 7, a period with second densest hatching is equivalent to a period until the remaining number warning is notified after the component shortage occurs in one component supply reel 7, and a period with lightest hatching is equivalent to a period after the remaining number warning is notified.

According to the example of FIG. 8, the component shortage occurs in the one component supply reel 7 at times t1a, t1b, t1c and t1d respectively for the tape feeders 5A, 5B, 5C and 5D. Further, the remaining number warning is notified at times t2a, t2b respectively for the tape feeders 5A and 5B. As a result, in Step S202, it is calculated that the attachment operation can be performed during the attachment possible periods Ta, Tb, Tc and Td respectively for the tape feeders 5A, 5B, 5C and 5D.

In Step S203 of FIG. 7, out of the plurality of (Nt) tape feeders 5, Nc candidate feeders having the overlapping attachment possible periods Ta, Tb, Tc and Td are specified by the setting unit 913 (here, Nc is an integer equal to or greater than 2 and equal to or smaller than Nt). Particularly, out of the Nt tape feeders 5, the candidate feeders are so specified that the attachment possible periods of the other tape feeders 5 overlap the attachment possible period Ta of the tape feeder 5A for which the remaining number warning is first notified. In the example here, three (Nc=3) tape feeders 5A, 5B and 5D are specifically specified as the candidate feeders since the attachment possible periods Ta, Tb and Td overlap in an overlapping period To.

In Step S204, an attachment time ts is set to overlap the attachment possible periods Ta, Tb and Td of the candidate feeders 5A, 5B and 5D by the setting unit 913. Specifically, a start time t1b of the overlapping period To during which the attachment possible periods Ta, Tb and Td overlap, i.e. the time t1b at which the component shortage of one component supply reel 7 occurs at last, out of the candidate feeders 5A, 5B and 5D, is set as the attachment time ts. In this way, the attachment time ts is made common to the three candidate feeders 5A, 5B and 5D, and the attachment operations for these candidate feeders 5A, 5B and 5D can be collectively performed by one replenishment operation. Note that the attachment time ts needs not necessarily coincide with the time t1b and may be set later than the time t1b. That is, the attachment time ts can be set at an appropriate time overlapping the overlapping period To.

Further, the component replenishment management apparatus 9 of this embodiment determines execution modes of the attachment operations for the candidate feeders 5A, 5B and 5D specified in this way based on the production planning Pp. Here, the execution mode of the attachment operation is a concept including whether or not to perform the attachment operation and which component supply reel 7 is used in the attachment operation.

Figure 9:
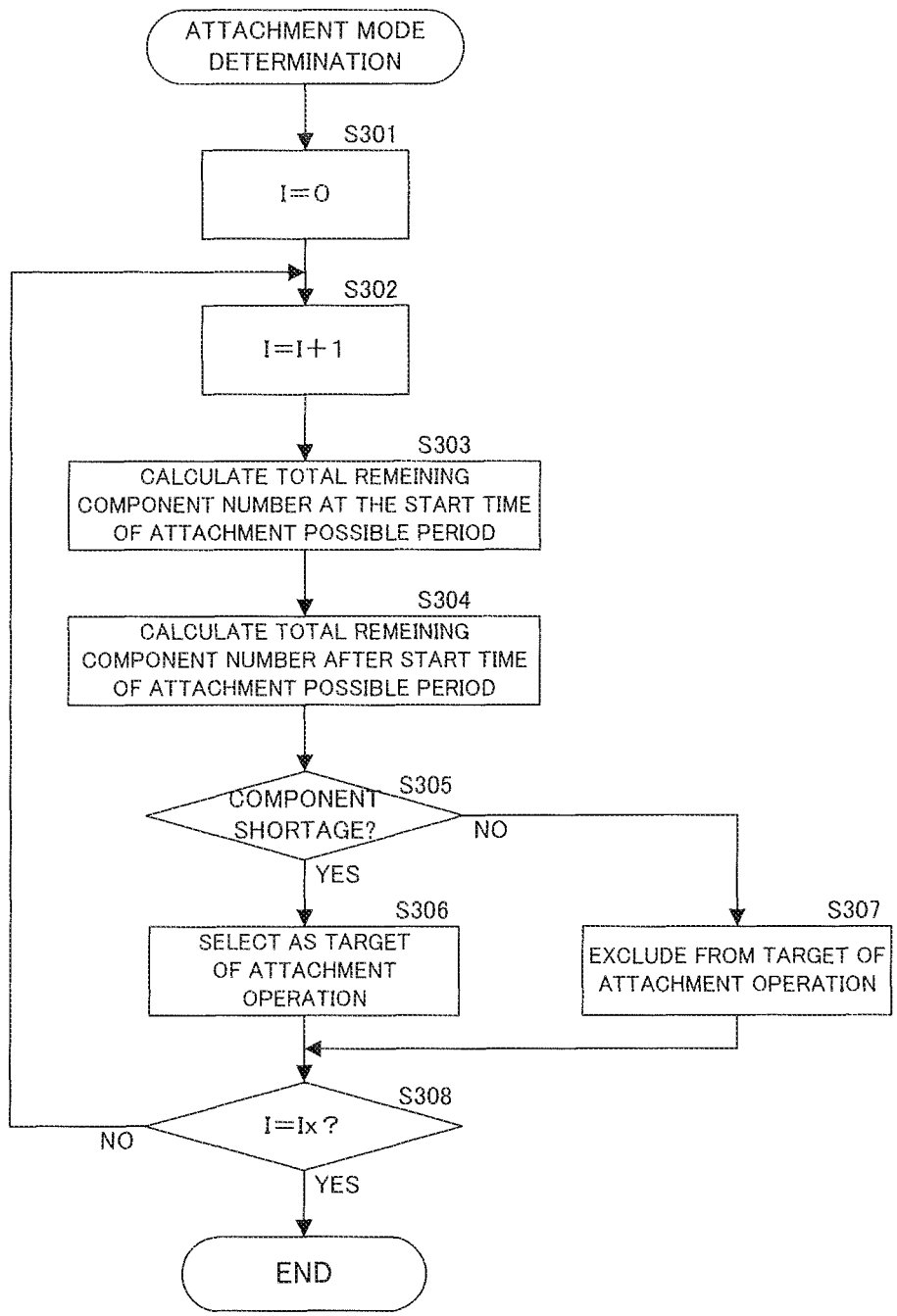
FIG. 9 is a flow chart showing a first example of attachment mode determination performed by the component replenishment management apparatus.

FIG. 9 is a flow chart showing a first example of attachment mode determination performed by the component replenishment management apparatus. This flow chart is performed by the determining unit 914 of the controller 91. In Step S301, a variable I for individually discriminating the tape feeders 5 specified as the candidate feeders is reset to zero. In Step S302, this variable I is incremented.

In Step S303, the total remaining component number at the start time of the attachment possible period for the $I^{th}$ tape feeder 5 is calculated based on the production planning Pp and the use history information H. Further, in Step S304, the number of the components planned to be supplied during a target period from the start of the attachment possible period to the end of the production planning Pp by $I^{th}$ tape feeder 5 is calculated based on the production planning Pp. Then, in Step S305, if the attachment operation is not performed at the attachment time ts set by the flow chart of FIG. 7, it is judged whether or not the component shortage occurs during this target period, i.e. whether or not the number of components planned to be supplied calculated in Step S304 is greater than the total remaining component number calculated in Step S303.

If the component shortage is judged to occur ("YES" in Step S305), the component shortage occurs unless the attachment operation is performed at the attachment time ts. Thus, the $I^{th}$ tape feeder 5 is selected as a target of the attachment operation corresponding to the attachment time ts (StepS306) and advance is made to Step S308. On the other hand, if the component shortage is judged not to occur ("NO" in Step S306), the component shortage does not occur even if the attachment operation is not performed at the attachment time ts. Thus, the $I^{th}$ tape feeder 5 is excluded from the targets of the attachment operation corresponding to the attachment time ts (Step S307) and advance is made to Step S308.

In Step S308, it is judged whether or not the variable I coincides with a maximum value Ix. Here, the maximum value Ix is the number of the tape feeders 5 specified as the candidate feeders. By repeating Steps S302 to S307 until the variable I coincides with the maximum value Ix, the execution mode of the attachment operation (whether or not to perform the attachment operation) is determined for all the tape feeders 5 specified as the candidate feeders. Further, the determining unit 914 notifies the operator via the user interface 94 to perform the attachment operation for the tape feeders 5 which are targets of the attachment operation at the attachment time ts.

Figure 10:
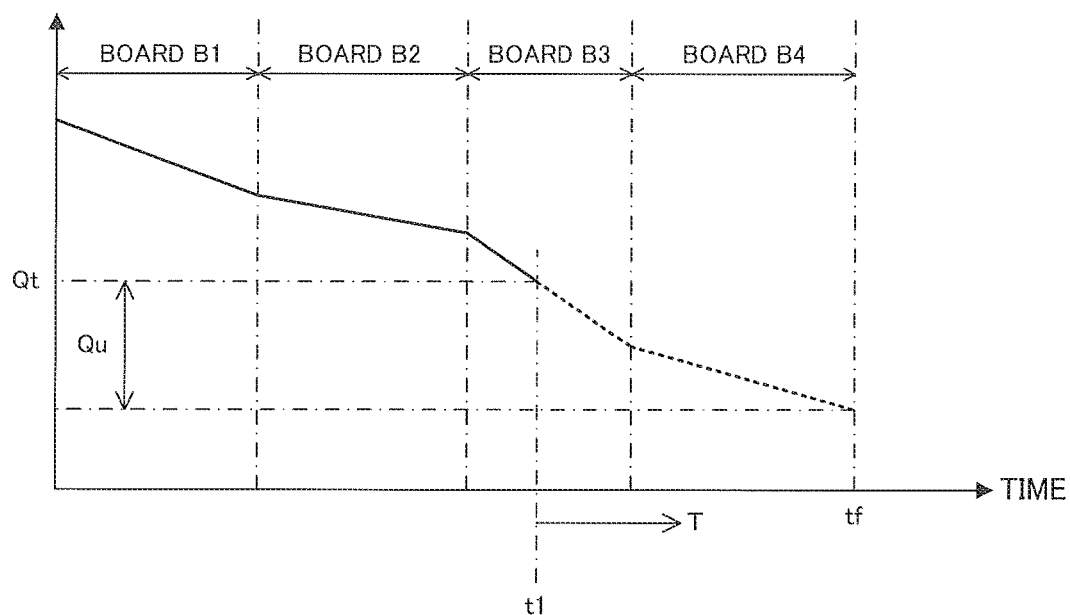
FIG. 10 is a timing chart schematically showing contents of calculation performed in the flow chart of FIG. 9.

FIG. 10 is a timing chart schematically showing contents of calculation performed in the flow chart of FIG. 9 and particularly shows an example corresponding to the tape feeder excluded from the targets of the attachment operation by the flow chart of FIG. 9. The timing chart of FIG. 10 shows a change of the total remaining component number associated with the execution of the production planning Pp for sequentially producing four mutually different types of components-mounted boards B1 to B4 with a vertical axis representing the total remaining component number for the tape feeder 5 and a horizontal axis representing time.

A rate of the components to be used (number of the components to be supplied per unit time) differs according to differences of the types of the boards B1 to B4. Thus, every time the board B1 to B4 to be produced is changed, the use rate of the components, i.e. the gradient of the timing chart, changes. If the component shortage occurs in the preceding component supply reel 7 used first, out of the two component supply reels 7 attached to the tape feeder 5, at time t1, the attachment possible period T starts. Further, after time t1, the succeeding component supply reel 7 used later, out of the two component supply reels 7, is used.

In Step S303 of FIG. 9 described above, a total remaining component number Qt at the start time t1 of the attachment possible period T is predicted based on the production planning Pp and the use history information H. This total remaining component number Qt is equivalent to the number of the components stored in the succeeding component supply reel 7. Here, the succeeding component supply reel 7 is the component supply reel 7 placed at the standby position Lw of FIG. 3. Further, a state is assumed in which the preceding component supply reel 7 at the use position Lu is not discharged immediately after the component shortage and the loading for the succeeding component supply reel 7 by the sprocket 54 is not started.

In Step S304, a number Qu of the components planned to be supplied by the tape feeder 5 from the start time t1 of this attachment possible period T to an end time tf of the production planning Pp is predicted based on the production planning Pp. In Step S305, the presence or absence of the component shortage is predicted based on whether or not the total remaining component number Qt is smaller than the number Qu of the components planned to be supplied. In the example of FIG. 10, since the total remaining component number Qt is equal to or greater than the number Qu of the components planned to be supplied, the component shortage is judged not to occur ("NO" in Step S305) and this tape feeder 5 is excluded from the targets of the attachment operation (Step S307).

Note that a similar management can be performed not only when the component shortage is judged at the end of the production planning Pp, but also when the type of the components to be supplied by the tape feeder 5 is changed as the type of components-mounted boards B is switched during the production planning Pp. That is, the succeeding component supply reel 7 may be similarly excluded from the targets of the attachment operation if the component shortage does not occur in the preceding component supply reel 7 until the type of components-mounted boards B is switched.

According to the above embodiment, the attachment possible period T during which the attachment operation of the component supply reel 7 can be performed is predicted for each of the Nt tape feeders 5 equipped in the component mounting apparatus 1, and the attachment time ts (first reference time) indicating a timing of the attachment operation is set to overlap the attachment possible periods T of the Nc candidate feeders 5, out of the Nt tape feeders 5. Thus, the attachment operations can be collectively performed for the Nc candidate feeders 5 by one replenishment operation and a frequency of the component replenishment operation of the operator can be suppressed. Further, the execution mode of the attachment operation for the candidate feeder 5 corresponding to the attachment time ts is determined based on the number Qu of the components planned to be supplied in accordance with the production planning Pp by the candidate feeder 5. Therefore, a number of the components suitable for the production planning Pp of the components-mounted boards can be replenished. As just described, in this embodiment, a number of the components suitable for the production planning Pp of the components-mounted boards can be replenished while the frequency of the component replenishment operation is suppressed.

Further, the determining unit 914 judges whether or not the total remaining component number Qt at the attachment time ts is sufficient for the number of the components planned to be supplied from the attachment time ts to the end of the production planning. Then, it is determined to perform the attachment operation according to the attachment time ts for the candidate feeders 5 judged to have the insufficient total remaining component number Qt, out of the Nc candidate feeders 5 and not to perform the attachment operation according to the attachment time ts for the candidate feeders 5 judged to have the sufficient total remaining component number Qt. In such a configuration, the occurrence of the attachment operations of the component supply reels 7 excessive for the production planning Pp can be suppressed and the frequency of the component replenishment operation can be effectively suppressed.

At a production site of components-mounted boards, all the components of the component supply reels 7 are not necessarily used up in every board production, and used component supply reels 7 having the components partially used are possibly present. As a result, a plurality of the component supply reels 7 including new and used ones can be used in the attachment operations for the candidate feeders 5 in some cases. An embodiment suitable in such a case is described next.

Figure 11:
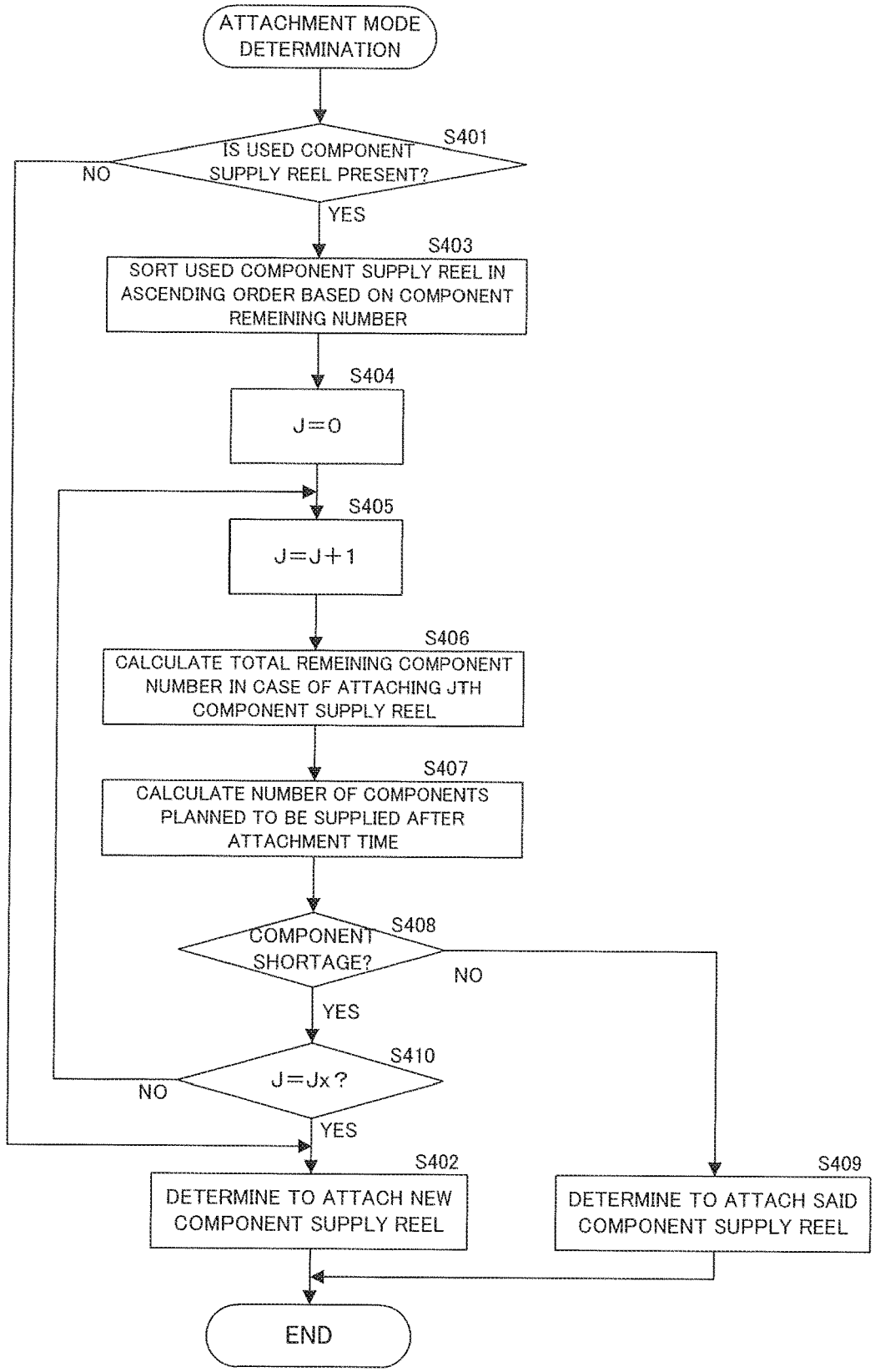
FIG. 11 is a flow chart showing a second example of the attachment mode determination performed by the component replenishment management apparatus.

FIG. 11 is a flow chart showing a second example of the attachment mode determination performed by the component replenishment management apparatus, and which ones of the component supply reels 7 are to be attached to the tape feeder 5 in the attachment operation corresponding to the attachment time ts is determined. This flow chart is performed by the determining unit 914 for each tape feeder 5 specified as the candidate feeder. Since contents of processing to be performed for each tape feeder 5 are similar, contents of processing to be performed for one tape feeder 5 are described.

In Step S401, the presence of any used component supply reel 7 usable in the attachment operation to the tape feeder 5 specified as the candidate feeder is judged. Specifically, whether or not any used component supply reel 7 storing the same type of the components as the components planned to be supplied by this tape feeder 5 is stored in the component storage cabinet 81 is judged based on the use history information H. If no such used component supply reel 7 is present ("NO" in Step S401), it is determined to attach a new component supply reel 7 (one target storage member) to this tape feeder 5 in the attachment operation corresponding to the attachment time ts (Step S402).

On the other hand, if such used component supply reels 7 (target storage members) are present ("YES" in Step S401), the used component supply reels 7 are sorted in an ascending order based on the remaining component numbers indicated in the use history information H (Step S403). Then, a variable J indicating a sorting order is reset to zero (Step S404) and incremented (Step S405).

In Step S406, the total remaining component number is calculated in the case of attaching the $J^{th}$ component supply reel 7 at the attachment time ts. Further, in Step S407, the number of the components planned to be supplied during a target period from the attachment time ts to the end of the production planning Pp is calculated. Then, in Step S408, it is judged whether or not the component shortage occurs during the target period in the case of attaching the $J^{th}$ component supply reel 7 at the attachment time ts, i.e. whether or not the number of the components planned to be supplied calculated in Step S407 is greater than the total remaining component number calculated in Step S406.

If the component shortage is judged not to occur ("NO" in Step S408), it is determined to attach the $J^{th}$ component supply reel 7 (one target storage member) to the target tape feeder 5 in the attachment operation corresponding to the attachment time ts (Step S409). On the other hand, if the component shortage is judged to occur ("YES" in Step S408), advance is made to Step S410 and it is judged whether or not the variable J coincides with a maximum value Jx. Here, the maximum value Jx is the number of the usable used component supply reels 7 (target storage members). Then, Steps S406 to S408 are repeated until the variable J reaches the maximum value Jx.

That is, if there is any component supply reel 7 (one target storage member) judged not to cause the component shortage in Step S408, out of the Jx used component supply reels 7, it is determined to attach this component supply reel 7 to the target tape feeder 5 in the attachment operation corresponding to the attachment time ts (Step S409). On the other hand, if no such component supply reel 7 is present, it is determined to attach a new component supply reel 7 (one target storage member) to the target tape feeder 5 in the attachment operation corresponding to the attachment time ts (Step S402). Further, the determining unit 914 notifies the operator via the user interface 94 to attach the component supply reel 7, the use of which is determined in Step S402 or S409, to the tape feeder 5 in the attachment operation at the attachment time ts.

Figure 12:
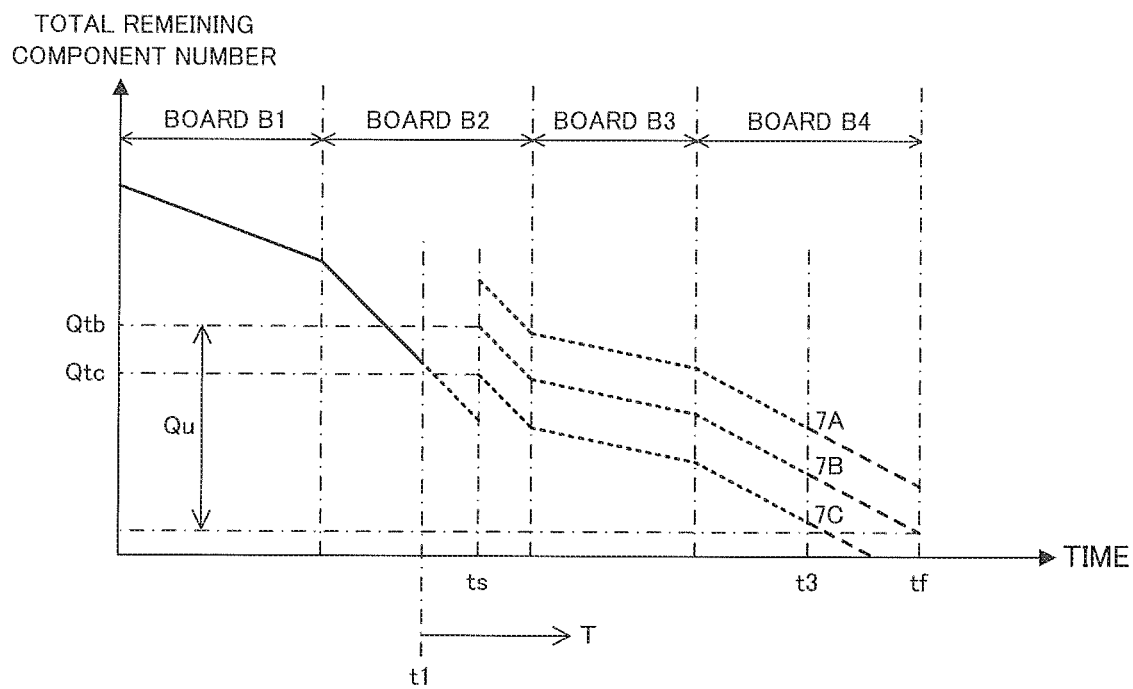
FIG. 12 is a timing chart schematically showing contents of calculation performed in the flow chart of FIG. 11.

FIG. 12 is a timing chart schematically showing contents of calculation performed in the flow chart of FIG. 11. The notation of FIG. 12 is similar to that of FIG. 10. If the component shortage occurs in the preceding component supply reel 7 used earlier, out of the two component supply reels 7 attached to the tape feeder 5, at time t1, the attachment possible period T starts. After time t1, the succeeding component supply reel 7 used later, out of the two component supply reels 7, is used.

Further, in an example of FIG. 12, three component supply reels 7A, 7B and 7C (a plurality of target storage members) having different stored component numbers are present as the component supply reels 7 attachable to the target tape feeder 5 in the attachment operation corresponding to the attachment time ts. Out of these, the component supply reel 7A is a new component supply reel 7, and each of the component supply reels 7B, 7C is a used component supply reel 7. Particularly in FIG. 12, changes of the total remaining component number after the attachment time ts are shown when each of the component supply reels 7A, 7B and 7C is attached in the attachment operation at the attachment time ts.

Incidentally, at the attachment time ts, the total remaining component number discontinuously increases as the attachment operation is performed. However, the component supply reel 7 used in component mounting before and after the attachment time ts is the succeeding component supply reels 7 described above. The use of the component supply reel 7A, 7B, 7C attached at the attachment time ts for component mounting is started after time t3 at which the component shortage occurs in the succeeding component supply reel 7.

In Step S403 of FIG. 11, these component supply reels are sorted in an order of 7C, 7B and 7A. In the flow chart of FIG. 11, in a loop at the variable J=1, a total remaining component number Qtc in the case of attaching the component supply reel 7C at the attachment time ts is predicted based on the production planning Pp (Step S406). Further, the number Qu of the components planned to be supplied from the attachment time ts to the end time tf of the production planning Pp is predicted based on the production planning Pp (Step S407). The occurrence of the component shortage is judged based on whether or not the total remaining component number Qtc is smaller than the number Qu of the components planned to be supplied (Step S408). Since the total remaining component number Qtc is smaller than the number Qu of the components planned to be supplied, it is judged that the component shortage occurs in the case of attaching the component supply reel 7C and return is made to Step S405.

In a loop at the variable J=2, Steps S406 to S408 are performed for the component supply reel 7B. Since a total remaining component number Qtb in the case of attaching the component supply reel 7B at the attachment time ts is equal to or greater than the number Qu of the components planned to be supplied, it is judged that the component shortage does not occur (NO) in Step S408. As a result, it is determined to use the component supply reel 7B (one component storage member) in the attachment operation at the attachment time ts (Step S409).

Note that a similar management can be performed not only when the component shortage is judged at the end of the production planning Pp, but also when the type of the components to be supplied by the tape feeder 5 is changed as the type of components-mounted boards B is switched. That is, if the component shortage does not occur even if the used component supply reel 7 is attached at the attachment time ts before the type of the components-mounted boards B is switched, it may be determined to similarly use this used component supply reel 7 in the attachment operation.

According to the above embodiment, the attachment possible period T during which the attachment operation of the component supply reel 7 can be performed is predicted for each of the Nt tape feeders 5 equipped in the component mounting apparatus 1, and the attachment time ts (first reference time) indicating a timing of the attachment operation is set to overlap the attachment possible periods T of the Nc candidate feeders 5, out of the Nt tape feeders 5. Thus, the attachment operations can be collectively performed for the Nc candidate feeders 5 by one replenishment operation and the frequency of the component replenishment operation by the operator can be suppressed. Further, the execution mode of the attachment operation for the candidate feeder 5 corresponding to the attachment time ts is determined based on the number Qu of the components planned to be supplied in accordance with the production planning Pp by the candidate feeder 5. Therefore, a number of the components suitable for the production planning Pp of the components-mounted boards can be replenished. As just described, in this embodiment, a number of the components suitable for the production planning Pp of the components-mounted boards can be replenished while the frequency of the component replenishment operation is suppressed.

Further, if the plurality of component supply reels 7A, 7B and 7C having different component storage numbers are usable in the attachment operation for the candidate feeders 5 as execution targets of the attachment operation corresponding to the attachment time ts, the determining unit 914 determines to use one component supply reel 7B, which is selected based on the number Qu of the components planned to be supplied after the attachment time ts in accordance with the production planning Pp, in the attachment operation. By this configuration, a number of the components suitable for the production planning Pp can be replenished while the used component supply reels 7 are efficiently used.

Further, the determining unit 914 determines to use one component supply reel 7B, which is selected from the plurality of component supply reels 7A, 7B and 7C based on the number Qu (first necessary number) of the components planned to be supplied from the attachment time ts to the end time tf of the production planning Pp in accordance with the production planning Pp, in the attachment operation. In such a configuration, a suitable number of the components necessary to end the production planning Pp can be replenished while the used component supply reels 7 are efficiently used.

Further, the determining unit 914 determines to use the component supply reel 7B having a smallest component storage number, out of the component supply reels 7B, 7A, which are assumed to make the total remaining component number equal to or greater than the number Qu (first necessary number) of the components planned to be supplied when being attached at the attachment time ts, in the attachment operation (Steps S405 to S409). In such a configuration, the used component supply reels 7 can be efficiently used in an ascending order from the one having a smallest component storage number.

Further, the determining unit 914 determines to use the component supply reel 7A having a largest component storage number, i.e. the new component supply reel 7A, out of the plurality of component supply reels 7, in the attachment operation if there is no component supply reel 7 which are assumed to make total remaining component number equal to the number Qu of the components planned to be supplied when being attached at the attachment time (Steps S405 to S408, S410, S402). In such a configuration, even a case where there is no suitable used component supply reel 7 can be properly dealt with.

The attachment operation needs to be repeatedly performed every time the component shortage occurs. Accordingly, for example, two attachment times ts may be set in advance. Further, the execution mode of the attachment operation at the first attachment time ts can be managed according to the number of the components planned to be supplied at the first and second attachment times ts (third example of the attachment mode determination). Next, such an embodiment is described.

Figure 13:
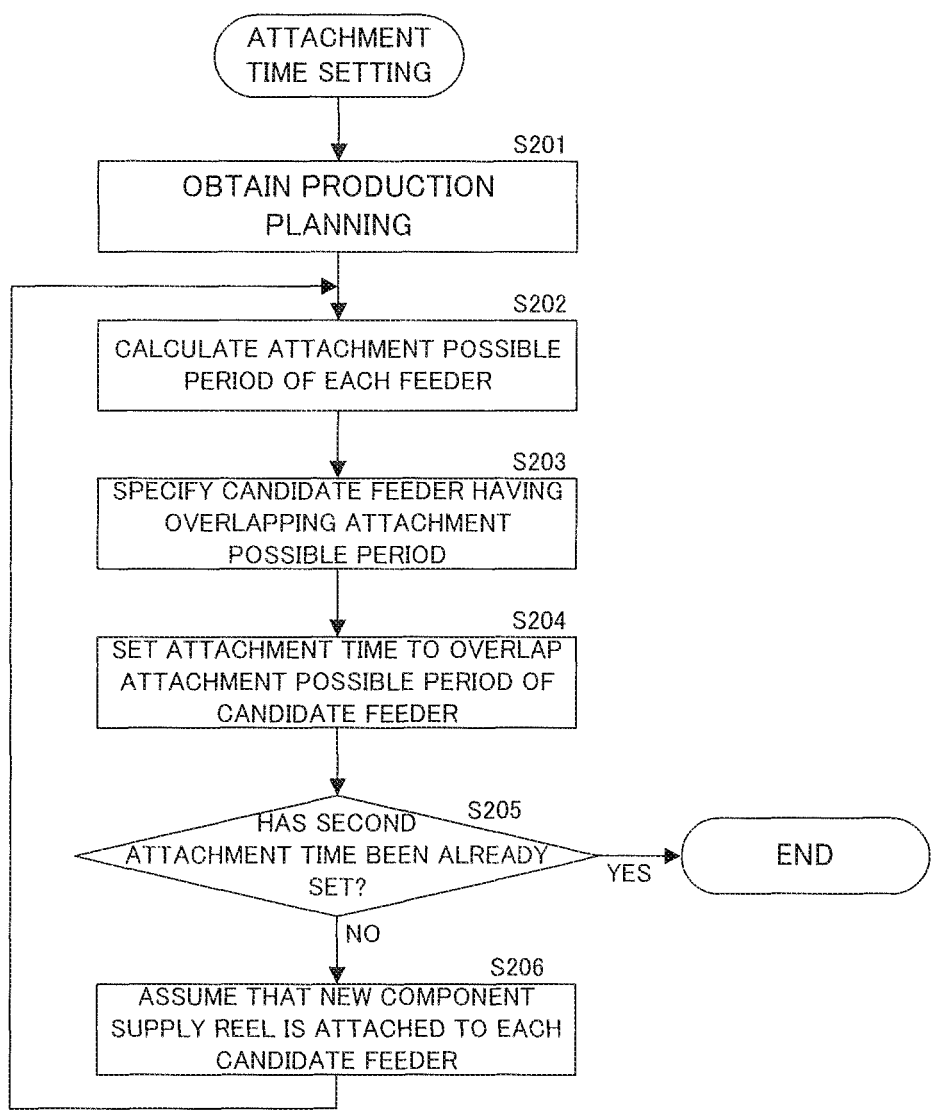
FIG. 13 is a flow chart showing a second example of the attachment time setting performed by the component replenishment management apparatus.

FIG. 13 is a flow chart showing a second example of the attachment time setting performed by the component replenishment management apparatus. This flow chart is performed by the obtaining unit 911, the predicting unit 912 and the setting unit 913 of the controller 91. Steps S201 to S204 are performed as in the first example of the attachment time setting described above using FIG. 7. As a result, a first attachment time ts1 is set similarly to the aforementioned attachment time ts.

Subsequently, in Step S205, whether or not a second attachment time ts2 has been already set is judged by the setting unit 913. Since the second attachment time ts2 is not set yet, "NO" is judged in Step S205 and the predicting unit 912 assumes that a new component supply reel 7 has been attached to each of the tape feeders 5 specified as candidate feeders at the first attachment time ts1 (Step S206). Further, Steps S201 to S204 are performed based on this assumption and the second attachment time ts2 is set. Then, in Step S205, it is judged that the second attachment time ts2 is already set (YES) and this flow chart ends.

Note that a method for setting the second attachment time ts2 is not limited to the example here. For example, a time after the elapse of a given time (e.g. 60 minutes) from the first attachment time ts1 may be set as the second attachment time ts2 without assuming the attachment of the new component supply reel 7 as in Step S206.

The third example of the attachment mode determination corresponding to the first and second attachment times ts1, ts2 set in this way can be performed in accordance with a flow chart similar to that of FIG. 11. However, in Step S407, the number of the components planned to be supplied between the first and second attachment times ts1, ts2 by the tape feeder 5 as a target of the attachment operation is calculated. Further, in Step S408, the occurrence of not the component shortage, but the remaining number warning is judged based on the calculation result of Step S407. This is described using FIG. 14.

Figure 14:
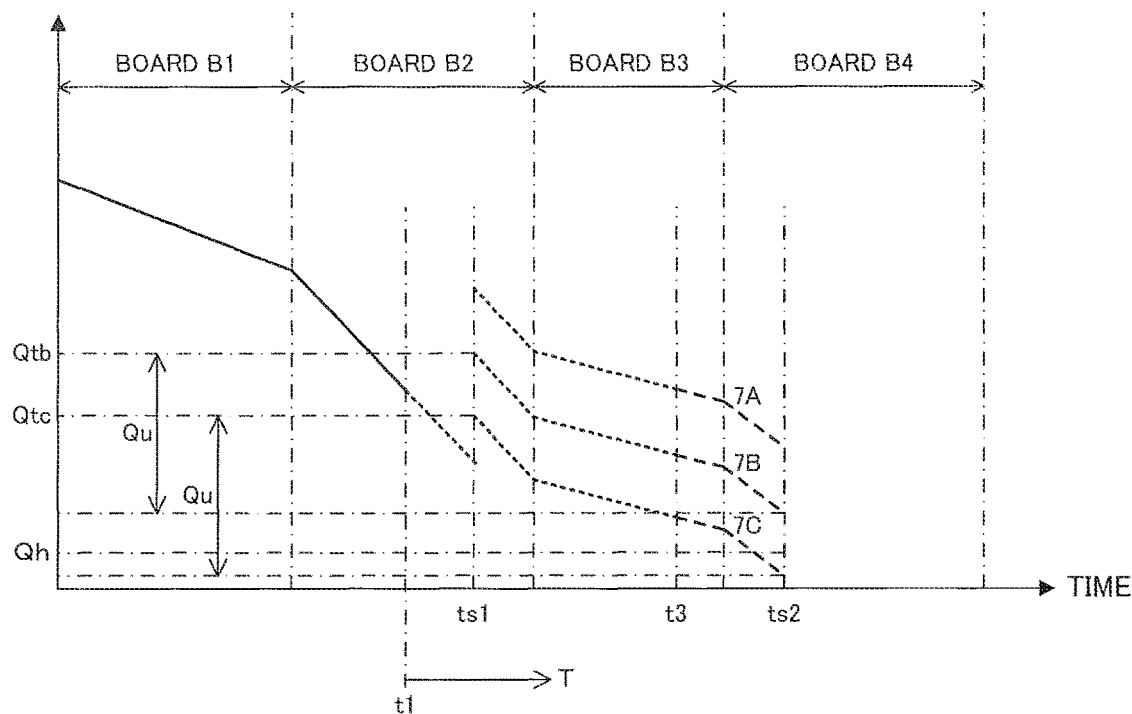
FIG. 14 is a timing chart schematically showing contents of calculation performed in the third example of the attachment mode determination performed by the component replenishment management apparatus.

FIG. 14 is a timing chart schematically showing contents of calculation performed in the third example of the attachment mode determination performed by the component replenishment management apparatus. The notation of FIG. 14 is similar to that of FIG. 10. If the component shortage occurs in the preceding component supply reel 7 used earlier, out of the two component supply reels 7 attached to the tape feeder 5, at time t1, the attachment possible period T starts. After time t1, the succeeding component supply reel 7 used later, out of the two component supply reels 7, is used.

Further, in an example of FIG. 14, three component supply reels 7A, 7B and 7C (a plurality of target storage members) having different stored component numbers are present as the component supply reels 7 attachable to the target tape feeder 5 in the attachment operation corresponding to the first attachment time ts 1. Out of these, the component supply reel 7A is a new component supply reel 7, and each of the component supply reels 7B, 7C is a used component supply reel 7. Particularly in FIG. 12, changes of the total remaining component number after the first attachment time ts1 are shown when each of the component supply reels 7A, 7B and 7C is attached in the attachment operation at the first attachment time ts1.

In the flow chart of FIG. 11, in the loop at the variable J=1, the number Qu of the components planned to be supplied from the first attachment time ts1 to the second attachment time ts2 is predicted based on the production planning Pp (Step S407). Then, the occurrence of the remaining number warning is judged based on whether or not the total remaining component number Qtc is equal to or smaller than the sum (second necessary number) of the number Qu of the components planned to be supplied and a threshold value Qh (predetermined number) (Step S408). Note that the threshold value Qh is a threshold value used as a reference in performing the remaining number warning in Step S108 of FIG. 6. Here, since the total remaining component number Qtc is equal to or smaller than the sum of the number Qu of the components planned to be supplied and the threshold value Qh, it is judged that the remaining number warning is given if the component supply reel 7C is attached and return is made to Step S405.

In the loop at the variable J=2, Steps S406 to S408 are performed for the component supply reel 7B. Since a total remaining component number Qtb in the case of attaching the component supply reel 7B at the first attachment time ts1 is greater than the sum of the number Qu of the components planned to be supplied and the threshold value Qh, it is judged that the remaining number warning is not given (NO) in Step S408. As a result, it is determined to use the component supply reel 7B (one component storage member) in the attachment operation at the first attachment time ts1 (Step S409).

According to the above embodiment, the determining unit 914 determines to use one component supply reel 7B, which is selected based on the number Qu of the components planned to be supplied after the attachment time ts1 in accordance with the production planning Pp, in the attachment operation if the plurality of component supply reels 7A, 7B and 7C having different component storage numbers are usable in the attachment operation for the candidate feeders 5 as the execution targets of the attachment operation corresponding to the attachment time ts1. By such a configuration, a number of the components suitable for the production planning PP can be replenished while the used component supply reels 7 are efficiently used.

Particularly, the setting unit 913 sets the second attachment time ts2 (second reference time) indicating a timing of the attachment operation coming next to the first attachment time ts1 (first reference time). Then, the determining unit 914 determines to use the component supply reel 7, which is selected from the plurality of component supply reels 7A, 7B and 7C based on the number Qu of the components planned to be supplied from the attachment time ts1 to the attachment time ts2 in accordance with the production planning Pp, in the attachment operation. In such a configuration, a suitable number of the components necessary until the attachment operation is performed according to the second attachment time ts2 after the attachment operation is performed according to the first attachment time ts1 can be replenished while the used component supply reels 7 are efficiently used.

Further, the determining unit 914 determines to use one component supply reel 7B, which is selected from the plurality of component supply reels 7A, 7B and 7C based on the sum (second necessary number) of the number Qu of the components planned to be supplied from the first attachment time ts1 to the second attachment time ts2 and the threshold value Qh, in the attachment operation. In this way, a suitable number of the components can be replenished such that the attachment possible period T does not elapse before the second attachment time ts2, i.e. such that a remaining number warning is not given.

That is, the determining unit 914 determines to use the component supply reel 7B (one target storage member) having a smallest component storage number, out of the component supply reels 7B, 7A, which are assumed to make the total remaining component numbers greater than the sum of the number Qu of the components planned to be supplied and the threshold value Qh when being attached at the first attachment time ts1, in the attachment operation corresponding to the attachment time ts1. In such a configuration, the used component supply reels 7 can be efficiently used in an ascending order from the one having a smallest component storage number.

As described above, the attachment mode of the component supply reel 7 corresponding to the attachment time ts can be determined in various modes. Then, the operator can be caused to perform the attachment operation of the component supply reel 7 according to the determined attachment mode. At this time, the component replenishment management apparatus 9 can perform various operations to assist the attachment operation of the operator.

Figure 15:
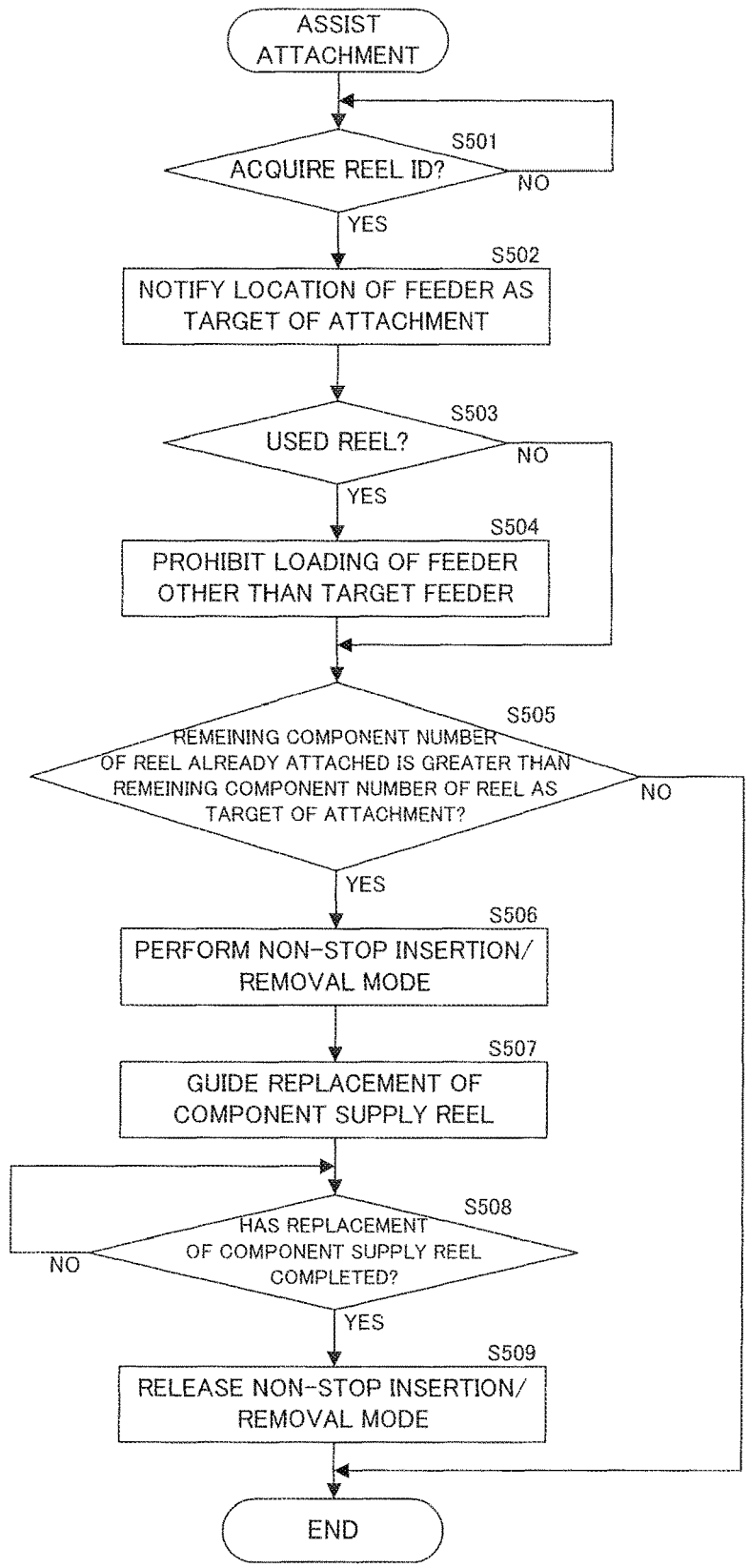
FIG. 15 is a flow chart showing an example of a control to assist the attachment operation of the operator.

FIG. 15 is a flow chart showing an example of a control to assist the attachment operation of the operator. This flow chart is performed by the controller 91 of the component replenishment management apparatus 9. If the acquisition of the reel ID 73 by the ID reader 93 is confirmed ("YES" in Step S501), the location of the tape feeder 5 as the target of the attachment operation of the component supply reel 7 indicated by the reel ID 73 is notified (Step S502). Such a notification may be made by displaying the location of the tape feeder 5 on the user interface 94 or may be made by turning on a lamp or the like provided in the tape feeder 5 by sending a command to the controller 18 of the component mounting apparatus 1.

Then, the controller 91 judges, based on the use history information H, whether or not the component supply reel 7 indicated by the reel ID 73 is used (Step S503). If the component supply reel 7 is not used ("NO" in Step S503), advance is made to Step S505. On the other hand, if the component supply reel 7 is used ("YES" in Step S503), the controller 91 advances to Step S505 after sending a command to the controller 18 of the component mounting apparatus 1 to prohibit the loading by the tape feeder 5 other than the tape feeder 5 as the target of the attachment operation.

In Step S505, the controller 91 judges, based on the use history information H, whether or not the remaining component number of the component supply reel 7 already attached to the tape feeder 5 and being used in component mounting (already attached component supply reel 7) is greater than the remaining component number of the component supply reel 7 as the target of the attachment operation (attachment target component supply reel 7). If the remaining component number of the already attached component supply reel 7 is equal to or smaller than the remaining component number of the attachment target component supply reel 7 ("NO" in Step S505), the flow chart of FIG. 15 is finished.

On the other hand, if the remaining component number of the already attached component supply reel 7 is greater than the remaining component number of the attachment target component supply reel 7 ("YES" in Step S505), the controller 91 (particularly, the determining unit 914) determines to perform Steps S506 to S509. Specifically, in Step S506, the controller 91 causes a non-stop insertion/removal mode to be performed by sending a command to the controller 18 of the component mounting apparatus 1. This non-stop insertion/removal mode is a mode in which the supply of the components by the target tape feeder 5 is prohibited for a given period and a mounting of the component supplied by the tape feeder 5 is changed to a timing after this period.

Then, the controller 19 guides the operator to replace the component supply reel 7 via the user interface 94 (Step S507). Upon receiving this guiding, the operator removes the component supply tape TP of the already attached component supply reel 7 from the tape feeder 5 and sandwiches this component supply tape TP between the sprocket 54 and the tape supporting member 56 while moving the already attached component supply reel 7 from the use position Lu to the standby position Lw. Further, the operator loads the component supply tape TP of the attachment target component supply reel 7 to the tape feeder 5. If the operator makes an input to the effect that the replacement of the component supply reel 7 has been completed in this way ("YES" in Step S508), the controller 91 releases the non-stop insertion/removal mode by sending a command to the controller 18 of the component mounting apparatus 1 (Step S509).

Figure 16:
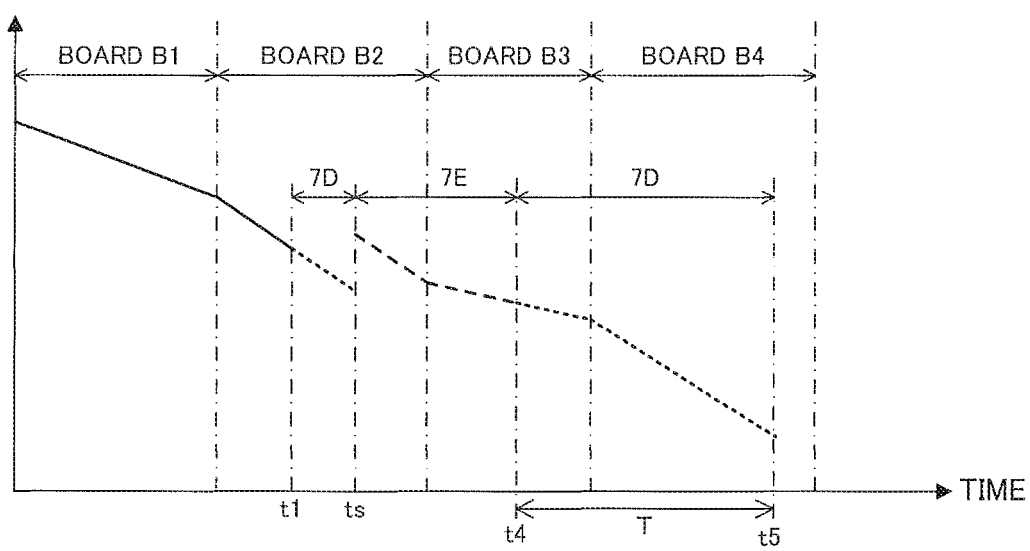
FIG. 16 is a timing chart schematically showing contents of calculation performed in the flow chart of FIG. 15.

FIG. 16 is a timing chart schematically showing contents of calculation performed in the flow chart of FIG. 15. The notation of FIG. 16 is similar to that of FIG. 10. If the component shortage occurs in the preceding component supply reel 7, out of the two component supply reels 7 attached to the tape feeder 5, at time t1, the use of the succeeding component supply reel 7D is started.

In an example of FIG. 16, the replacement of the component supply reel 7 is performed in the attachment operation at the attachment time ts and the component supply reel 7 used in component mounting is replaced from the already attached component supply reel 7D to the attachment target component supply reel 7E. If the component shortage occurs in the component supply reel 7E at time t4, the use of the component supply reel 7D is started and the remaining component number of the component supply reel 7D decreases to a threshold value at time t5.

That is, the determining unit 914 determines to perform the attachment operation while the component supply reel 7 used in a component supply operation is switched to another component supply reel 7E if the component storage number of this another component supply reel 7E is smaller than that of the component supply reel 7D being used in the component supply operation at the attachment time ts. In such a configuration, a long attachment possible period T (FIG. 16) coming next to the attachment operation corresponding to the attachment time ts can be ensured as compared to the case where the component supply reel 7E is attached without performing such a switch, and spare time used in the attachment operation to be performed according to the attachment possible period T can be created.

As just described, in this embodiment, the component mounting system 100 corresponds to an example of a "component mounting system" of the disclosure, the component mounting apparatus 1 corresponds to an example of a "component mounting apparatus" of the disclosure, the component replenishment management apparatus 9 corresponds to an example of a "component replenishment management apparatus" of the disclosure, the obtaining unit 911 corresponds to an example of an "obtaining unit" of the disclosure, the predicting unit 912 corresponds to an example of a "predicting unit" of the disclosure, the setting unit 913 corresponds to an example of a "setting unit" of the disclosure, the determining unit 914 corresponds to an example of a "determining unit" of the disclosure, the component supply reel 7 corresponds to an example of a "component storage member" of the disclosure, the tape feeder 5 corresponds to an example of a "feeder" of the disclosure, each of the candidate feeders 5A, 5B and 5D corresponds to an example of a "candidate feeder" of the disclosure, the board B corresponds to an example of a "board" of the disclosure, the production planning Pp corresponds to an example of a "production planning" of the disclosure, the attachment time ts or the first attachment time ts1 corresponds to an example of a "first reference time" of the disclosure, the attachment time ts2 corresponds to an example of a "second reference time" of the disclosure, each of the component supply reels 7A, 7B and 7C corresponds to an example of a "target storage member" of the disclosure, the threshold value Qh corresponds to an example of a "predetermined number" of the disclosure, the number Qu of the components planned to be supplied corresponds to an example of a "first necessary number" of the disclosure, and the sum of the number Qu of the components planned to be supplied and the threshold value Qh corresponds to an example of a "second necessary number" of the disclosure.

Note that the disclosure is not limited to the above embodiments and various changes can be added to the aforementioned embodiments without departing from the gist of the disclosure. For example, although an execution timing of the attachment mode determination is not particularly described in the above embodiments, the attachment mode determination can be performed at various timings. Specifically, the attachment mode determination may be performed before the start of the production planning Pp or the attachment mode determination may be performed for the next attachment operation every time the attachment operation is performed.

Further, the number of the component supply reels 7 attachable to one tape feeder 5 is not limited to two and may be three or more.

Further, the type of the feeders is not limited to tape feeders and may be tray feeders or stick feeders.

All the items (remaining component number, feeder in use, location) shown in FIG. 5 need not be included in the use history information H and these items may be omitted as appropriate.

What is claimed is:

1. A component replenishment management apparatus, comprising:
    an obtaining unit configured to obtain a production planning to produce components-mounted boards by mounting components on boards using Nt feeders, each of the Nt feeders being configured to perform a component supply operation of using sequentially a plurality of attached component storage members to supply components from the component storage members, Nt being an integer equal to or greater than 2;
    a predicting unit configured to predict an attachment possible period for each of the Nt feeders, the attachment possible period being a period until a total remaining component number, which is a total number of the components remaining in the plurality of component storage members, decreases to a predetermined number after the components of one component storage member used first, out of the plurality of component storage members, are used up;
    a setting unit configured to set a first reference time so that the first reference time overlaps the attachment possible periods for Nc candidate feeders out of the Nt feeders, the first reference time indicating a timing of an attachment operation of attaching another component storage member storing the components after the components of the one component storage member are used up, Nc being an integer equal to or greater than 2 and equal to or smaller than Nt; and
    a determining unit configured to determine an execution mode of the attachment operation for the candidate feeder corresponding to the first reference time based on a number of the components planned to be supplied by the candidate feeder in accordance with the production planning.

2. The component replenishment management apparatus according to claim 1, wherein:
the determining unit is configured to judge for the candidate feeders whether or not the total remaining component number at the first reference time is sufficient for a number of the components planned to be supplied from the first reference time to an end of the production planning, such that the determining unit
determines to perform the attachment operation according to the first reference time for the candidate feeder judged to have an insufficient total remaining component number, out of the Nc candidate feeders, and
determines not to perform the attachment operation according to the first reference time for the candidate feeder judged to have a sufficient total remaining component number.

3. The component replenishment management apparatus according to claim 2, wherein:
the determining unit is configured to determine to use one component storage member in the attachment operation if a plurality of target storage members having different component storage numbers are present as another component storage member usable in the attachment operation for the candidate feeder as an execution target of the attachment operation according to the first reference time,
the one component storage member is selected from the plurality of target storage members by the determining unit based on a number of the components planned to be supplied after the first reference time in accordance with the production planning.

4. The component replenishment management apparatus according to claim 2, wherein:
the determining unit is configured to determine to perform the attachment operation while switching the component storage member used in the component supply operation to another component storage member if the component storage number of another component storage member is smaller than the component storage number of the component storage member being used in the component supply operation at the first reference time.

5. A component mounting system, comprising:
a component mounting apparatus configured to perform a production planning to produce components-mounted boards by mounting components on boards using Nt feeders, each of the Nt feeders performing a component supply operation of using sequentially a plurality of attached component storage members to supply components from the component storage members, Nt being an integer equal to or greater than 2; and
the component replenishment management apparatus according to claim 2.

6. The component replenishment management apparatus according to claim 1, wherein:
the determining unit is configured to determine to use one component storage member in the attachment operation if a plurality of target storage members having different component storage numbers are present as another component storage member usable in the attachment operation for the candidate feeder as an execution target of the attachment operation according to the first reference time,
the one component storage member is selected from the plurality of target storage members by the determining unit based on a number of the components planned to be supplied after the first reference time in accordance with the production planning.

7. The component replenishment management apparatus according to claim 6, wherein:
the determining unit is configured to determine to use one target storage member, which is selected from the plurality of target storage members based on a first necessary number which is a number of the components planned to be supplied from the first reference time to an end of the production planning in accordance with the production planning, in the attachment operation.

8. The component replenishment management apparatus according to claim 7, wherein:
the determining unit is configured to select the target storage member having a smallest component storage number, out of the target storage members which are assumed to make the total remaining component number equal to or greater than the first necessary number when being attached at the first reference time, as the one target storage member.

9. The component replenishment management apparatus according to claim 8, wherein:
the determining unit is configured to select the target storage member having a greatest component storage number, out of the plurality of target storage members, as the one target storage member if there is no target storage member assumed to make the total remaining component number equal to or greater than the first necessary number when being attached at the first reference time.

10. The component replenishment management apparatus according to claim 8, wherein:
the determining unit is configured to determine to perform the attachment operation while switching the component storage member used in the component supply operation to another component storage member if the component storage number of another component storage member is smaller than the component storage number of the component storage member being used in the component supply operation at the first reference time.

11. The component replenishment management apparatus according to claim 7, wherein:
the determining unit is configured to select the target storage member having a smallest component storage number, out of the target storage members which are assumed to make the total remaining component number greater than the second necessary number when being attached at the first reference time, as the one target storage member.

12. The component replenishment management apparatus according to claim 7, wherein:
the determining unit is configured to determine to perform the attachment operation while switching the component storage member used in the component supply operation to another component storage member if the component storage number of another component storage member is smaller than the component storage number of the component storage member being used in the component supply operation at the first reference time.

13. A component mounting system, comprising:
a component mounting apparatus configured to perform a production planning to produce components-mounted boards by mounting components on boards using Nt feeders, each of the Nt feeders performing a component supply operation of using sequentially a plurality of attached component storage members to supply components from the component storage members, Nt being an integer equal to or greater than 2; and the component replenishment management apparatus according to claim 7.

14. The component replenishment management apparatus according to claim 6, wherein:

the setting unit is configured to set a second reference time indicating a timing of the attachment operation coming next to the first reference time, and the determining unit is configured to determine to use one target storage member, which is selected from the plurality of target storage members based on a number of the components planned to be supplied from the first reference time to the second reference time in accordance with the production planning, in the attachment operation.

15. The component replenishment management apparatus according to claim 14, wherein:

the determining unit is configured to determine to use one target storage member, which is selected from the plurality of target storage members based on a second necessary number which is a sum of the number of the components planned to be supplied from the first reference time to the second reference time and the predetermined number, in the attachment operation.

16. The component replenishment management apparatus according to claim 6, wherein:

the determining unit is configured to determine to perform the attachment operation while switching the component storage member used in the component supply operation to another component storage member if the component storage number of another component storage member is smaller than the component storage number of the component storage member being used in the component supply operation at the first reference time.

17. A component mounting system, comprising:

a component mounting apparatus configured to perform a production planning to produce components-mounted boards by mounting components on boards using Nt feeders, each of the Nt feeders performing a component supply operation of using sequentially a plurality of attached component storage members to supply components from the component storage members, Nt being an integer equal to or greater than 2; and the component replenishment management apparatus according to claim 6.

18. The component replenishment management apparatus according to claim 1, wherein:

the determining unit is configured to determine to perform the attachment operation while switching the component storage member used in the component supply operation to another component storage member if the component storage number of another component storage member is smaller than the component storage number of the component storage member being used in the component supply operation at the first reference time.

19. A component mounting system, comprising:

a component mounting apparatus configured to perform a production planning to produce components-mounted boards by mounting components on boards using Nt feeders, each of the Nt feeders performing a component supply operation of using sequentially a plurality of attached component storage members to supply components from the component storage members, Nt being an integer equal to or greater than 2; and the component replenishment management apparatus according to claim 1.

20. A component replenishment management method, comprising:

obtaining a production planning to produce components-mounted boards by mounting components on boards using Nt feeders, each of the Nt feeders performing a component supply operation of using sequentially a plurality of attached component storage members to supply components from the component storage members, Nt being an integer equal to or greater than 2;

predicting an attachment possible period for each of the Nt feeders, the attachment possible period being a period until a total remaining component number, which is a total number of the components remaining in the plurality of component storage members, decreases to a predetermined number after the components of one component storage member used first, out of the plurality of component storage members, are used up;

setting a first reference time so that the first reference time overlaps the attachment possible periods for Nc candidate feeders out of the Nt feeders, the first reference time indicating a timing of an attachment operation of attaching another component storage member storing the components after the components of the one component storage member are used up, Nc being an integer equal to or greater than 2 and equal to or smaller than Nt; and determining an execution mode of the attachment operation for the candidate feeder corresponding to the first reference time based on a number of the components planned to be supplied by the candidate feeder in accordance with the production planning.

* * * * *